United States Patent
Hagihara

(10) Patent No.: US 10,958,283 B2
(45) Date of Patent: Mar. 23, 2021

(54) AD CONVERSION CIRCUIT, IMAGING DEVICE, AND ENDOSCOPE SYSTEM

(71) Applicant: OLYMPUS CORPORATION, Hachioji (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/896,494

(22) Filed: Jun. 9, 2020

(65) Prior Publication Data
US 2020/0304136 A1 Sep. 24, 2020

Related U.S. Application Data

(63) Continuation of application No. PCT/JP2017/044537, filed on Dec. 12, 2017.

(51) Int. Cl.
*H03M 1/46* (2006.01)
*H03M 1/18* (2006.01)
*H03M 1/36* (2006.01)

(52) U.S. Cl.
CPC .......... *H03M 1/466* (2013.01); *H03M 1/18* (2013.01); *H03M 1/362* (2013.01); *H03M 1/462* (2013.01)

(58) Field of Classification Search
CPC ........ H03M 1/466; H03M 1/18; H03M 1/362; H03M 1/462

(Continued)

(56) References Cited

U.S. PATENT DOCUMENTS 6,144,331 A * 11/2000 Jiang .................. H03M 1/0682
341/150
6,304,199 B1 * 10/2001 Fang .................. H03M 1/0624
341/118

(Continued)

FOREIGN PATENT DOCUMENTS

EP    0 508 637 A2    10/1992
JP    5-191286 A    7/1993

(Continued)

OTHER PUBLICATIONS

Liu et al., "A 0.92mW 10-bit 50-MS/s SAR ADC in 0.13 μm CMOS Process", IEEE Symposium on VLSI Circuits Digest of Technical Papers, Jun. 2009, pp. 236 and 237, cited in Specification (2 pages).

(Continued)

*Primary Examiner* — Lam T Mai
(74) *Attorney, Agent, or Firm* — Westerman, Hattori, Daniels & Adrian, LLP

(57) ABSTRACT

An AD conversion circuit includes a comparison circuit, a first DA conversion circuit including a plurality of resistance elements, and a first voltage output circuit. A comparator of the comparison circuit outputs a signal that represents a result of comparing a first voltage of a first input terminal with a second voltage of a second input terminal. A first combined resistance value of the first DA conversion circuit and the first voltage output circuit seen from a second terminal of the first capacitance element is a first value when the first capacitance element holds a first signal. The first combined resistance value is a second value when the comparator compares the first voltage with the second voltage. The first value is less than the second value.

12 Claims, 15 Drawing Sheets

(58) Field of Classification Search
USPC .................................................. 341/155–172
See application file for complete search history.

(56) References Cited

U.S. PATENT DOCUMENTS

| | | | | |
|---|---|---|---|---|
| 7,265,708 | B2* | 9/2007 | Mitra | H03M 1/004 341/155 |
| 2002/0190887 | A1 | 12/2002 | Takata et al. | |
| 2006/0187106 | A1* | 8/2006 | Mitra | H03M 1/004 341/155 |
| 2011/0043400 | A1* | 2/2011 | Sawai | H03M 1/1071 341/161 |
| 2015/0381866 | A1* | 12/2015 | Ono | A61B 1/045 348/68 |
| 2016/0373666 | A1* | 12/2016 | Ono | H04N 5/357 |
| 2018/0146152 | A1* | 5/2018 | Hagihara | H04N 5/374 |
| 2019/0110012 | A1* | 4/2019 | Hagihara | H03M 1/745 |
| 2019/0305792 | A1* | 10/2019 | Hasegawa | H03M 1/56 |
| 2020/0221045 | A1* | 7/2020 | Hagihara | H04N 5/378 |
| 2020/0358975 | A1* | 11/2020 | Hagihara | H04N 5/37457 |

FOREIGN PATENT DOCUMENTS

| | | |
|---|---|---|
| JP | 6-120828 A | 4/1994 |
| JP | 2002-374169 A | 12/2002 |
| JP | 2004-260263 A | 9/2004 |
| JP | 2015-198319 A | 11/2015 |
| JP | 2016-5171 A | 1/2016 |

OTHER PUBLICATIONS

Wäny et al., "Ultrasmall digital image sensor for endoscopic applications", IISW, Jun. 2009 (4 pages).

International Search Report dated Mar. 13, 2018, issued in counterpart International Application No. PCT/JP2017/044537, w/English translation (4 pages).

* cited by examiner

AD CONVERSION CIRCUIT, IMAGING DEVICE, AND ENDOSCOPE SYSTEM

BACKGROUND OF THE INVENTION

Field of the Invention

The present invention relates to an AD conversion circuit, an imaging device, and an endoscope system.

The present application is a continuation application based on International Patent Application No. PCT/JP2017/044537 filed on Dec. 12, 2017, the content of which is incorporated herein by reference.

Description of Related Art

Physical quantity detection semiconductor devices having sensors sensitive to externally input electromagnetic waves (light, radiation, etc.) are used in various fields. A physical quantity is converted into an electrical signal by a sensor. For example, a sensor in an imaging device is a pixel. Generally, electrical signals of a reference level and a signal level are read from the sensor. For example, the reference level in the imaging device is a reset level. Particularly, in the field of video devices, a charge-coupled device (CCD) type or metal oxide semiconductor (MOS) type imaging device for detecting light as a physical quantity is used. Light is an example of electromagnetic waves. A MOS type imaging device includes a (C)MOS type imaging device including pixels constituting an active pixel sensor (APS). A pixel constituting the APS amplifies a pixel signal in accordance with signal charge generated by a photoelectric conversion unit and outputs the amplified pixel signal.

In an endoscope system using an imaging device, it is important to reduce the size of the imaging device in order to reduce the size of a scope. For this reason, a CCD type imaging device has been generally used. However, since the output of the CCD type imaging device is analog, the length of the scope becomes long, so degradation of image quality due to superimposition of noise has been problematic. In recent years, in order to solve this problem, a digital-output CMOS type imaging device in which an AD conversion circuit is built in has been used.

For example, in following Non-Patent Literature 1, an AD conversion circuit that includes a capacitance element and is able to reduce power consumption is disclosed. In an AD conversion circuit using a capacitance element, the area of the capacitance element exponentially increases in conjunction with the increase in resolution. For this reason, reducing the size of an AD conversion circuit and reducing the size of an imaging device including the AD conversion circuit are difficult.

Non-Patent Literature 1: C. C. Liu, S. J. Chang, G. Y. Huang, and Y. Z. Lin "A 0.92 mW 10-bit 50-MS/s SAR ADC in 0.13 μm CMOS process," in IEEE Symposium on VLSI Circuits Digest of Technical Papers, June 2009, pp. 236-237.

In an AD conversion circuit using a resistance element, it is possible to constitute at least part of a DA conversion circuit by using an R-2R ladder circuit. In this way, it is possible to suppress area increase, compared to a resistance-parallel type AD conversion circuit. For example, in FIG. 9 of Japanese Unexamined Patent Application, First Publication No. 2015-005171, an AD conversion circuit including a DA conversion circuit including an R-2R ladder circuit is disclosed.

SUMMARY OF THE INVENTION

According to a first aspect of the present invention, an AD conversion circuit includes a comparison circuit, a first DA conversion circuit including a plurality of resistance elements, and a first voltage output circuit. The comparison circuit includes a first capacitance element, a second capacitance element, and a comparator. The first capacitance element includes a first terminal to which a first signal is input and a second terminal electrically connected to the first DA conversion circuit and the first voltage output circuit. The first capacitance element is configured to hold the first signal. The second capacitance element includes a first terminal to which a second signal is input and a second terminal connected to a first voltage source. The second capacitance element is configured to hold the second signal. The comparator includes a first input terminal connected to the first terminal of the first capacitance element and includes a second input terminal connected to the first terminal of the second capacitance element. The comparator is configured to output a signal that represents a result of comparing a first voltage of the first input terminal with a second voltage of the second input terminal. A first combined resistance value of the first DA conversion circuit and the first voltage output circuit seen from the second terminal of the first capacitance element is a first value when the first capacitance element holds the first signal. The first combined resistance value is a second value when the comparator compares the first voltage with the second voltage. The first value is less than the second value.

According to a second aspect of the present invention in the first aspect, the first voltage output circuit may be configured to output a third voltage to the second terminal of the first capacitance element when the first capacitance element holds the first signal. The first voltage output circuit may be electrically insulated from the second terminal of the first capacitance element when the comparator compares the first voltage with the second voltage.

According to a third aspect of the present invention, in the first aspect, a resistance value of the first voltage output circuit when the comparator compares the first voltage with the second voltage may be greater than a resistance value of the first voltage output circuit when the first capacitance element holds the first signal.

According to a fourth aspect of the present invention, in any of the first to third aspects, at least part of the plurality of resistance elements included in the first DA conversion circuit may form an R-2R ladder circuit.

According to a fifth aspect of the present invention, in any of the first to fourth aspects, the AD conversion circuit may further include an adjustment circuit configured to adjust a full-scale range of the first DA conversion circuit.

According to a sixth aspect of the present invention, in any of the first to fifth aspects, the AD conversion circuit may further include a second DA conversion circuit including a plurality of resistance elements and a second voltage output circuit. The second terminal of the second capacitance element may be electrically connected to the second DA conversion circuit and the second voltage output circuit that are the first voltage source. A second combined resistance value of the second DA conversion circuit and the second voltage output circuit seen from the second terminal of the second capacitance element may be a third value when the second capacitance element holds the second signal. The second combined resistance value may be a fourth value when the comparator compares the first voltage with the second voltage. The third value may be less than the fourth value.

According to a seventh aspect of the present invention, in the sixth aspect, the second voltage output circuit may be configured to output a fourth voltage to the second terminal of the second capacitance element when the second capacitance element holds the second signal. The second voltage output circuit may be electrically insulated from the second terminal of the second capacitance element when the comparator compares the first voltage with the second voltage.

According to an eighth aspect of the present invention, in the sixth aspect, a resistance value of the second voltage output circuit when the comparator compares the first voltage with the second voltage may be greater than a resistance value of the second voltage output circuit when the second capacitance element holds the second signal.

According to a ninth aspect of the present invention, an imaging device includes the AD conversion circuit in any of the first to eighth aspects, a plurality of pixels, and a column circuit. The plurality of pixels are disposed in a matrix shape. The plurality of pixels are configured to output a first pixel signal having a signal level and a second pixel signal having a reset level. The column circuit is disposed so as to correspond to one or more columns in an array of the plurality of pixels. The column circuit is configured to generate the first signal in accordance with the first pixel signal and the second signal in accordance with the second pixel signal.

According to a tenth aspect of the present invention, an imaging device includes the AD conversion circuit in any of the first to eighth aspects, a plurality of pixels, a column circuit, and a reference signal generation circuit. The plurality of pixels are disposed in a matrix shape. The plurality of pixels are configured to output a first pixel signal having a signal level and a second pixel signal having a reset level. The column circuit is disposed so as to correspond to one or more columns in an array of the plurality of pixels. The column circuit is configured to generate the first signal in accordance with a difference between the reset level and the signal level. The reference signal generation circuit is configured to generate the second signal having a predetermined level.

According to an eleventh aspect of the present invention, an endoscope system includes the imaging device in the ninth aspect.

According to a twelfth aspect of the present invention, an endoscope system includes the imaging device in the tenth aspect.

DETAILED DESCRIPTION OF THE INVENTION

Hereinafter, embodiments of the present invention will be described with reference to the drawings.

First Embodiment

Figure 1:
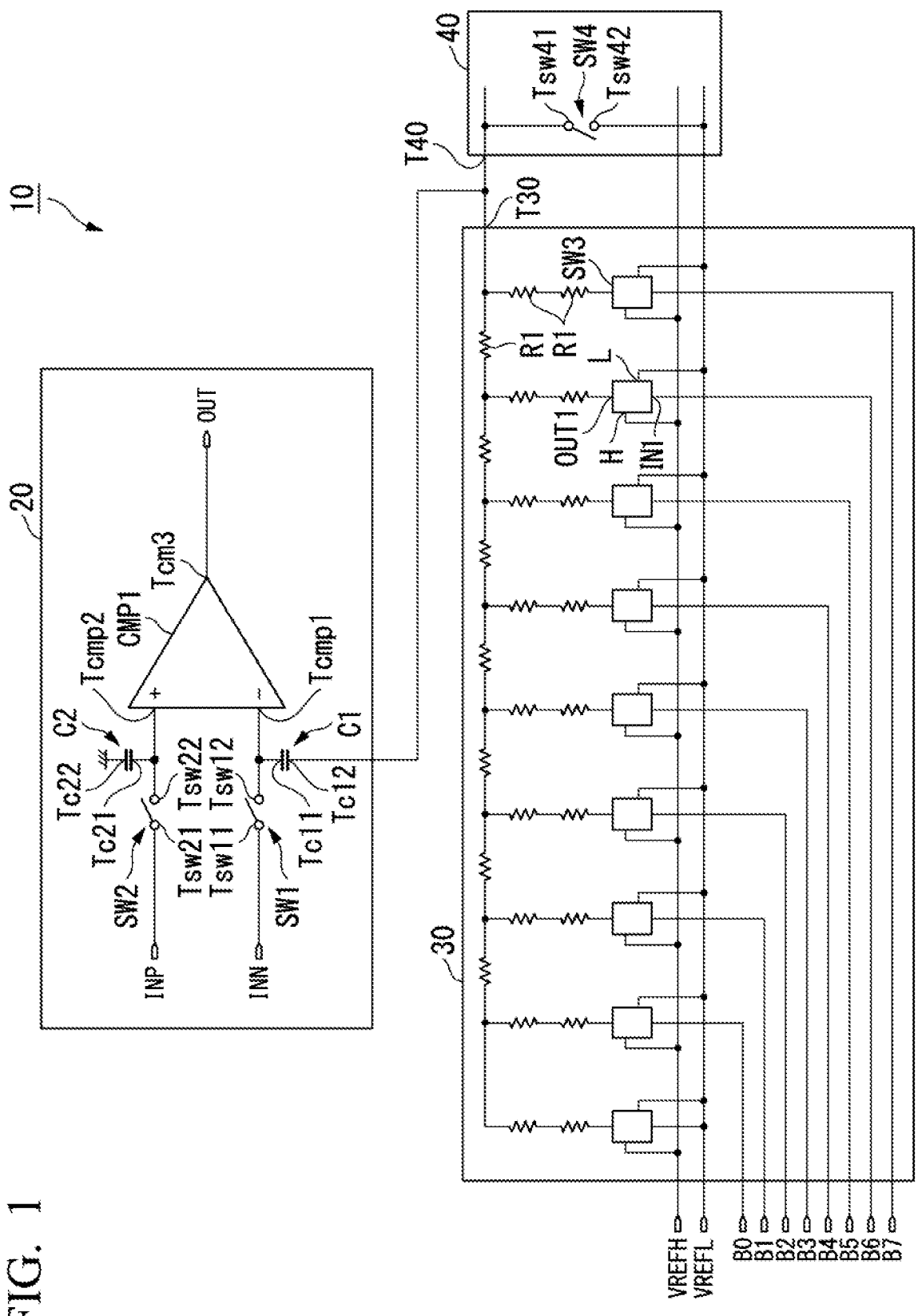
FIG. 1 is a circuit diagram showing a configuration of an AD conversion circuit according to a first embodiment of the present invention.

FIG. 1 shows a configuration of an analog-to-digital (AD) conversion circuit 10 according to a first embodiment of the present invention. As shown in FIG. 1, the AD conversion circuit 10 includes a first comparison circuit 20, a first digital-to-analog (DA) conversion circuit 30, and a first voltage output circuit 40.

A schematic configuration of the AD conversion circuit 10 will be described. The first comparison circuit 20 includes a comparator CMP1, a first capacitance element C1, and a second capacitance element C2. The first capacitance element C1 includes a first terminal Tc11 and a second terminal Tc12. A first signal INN is input to the first terminal Tc11 of the first capacitance element C1. The second terminal Tc12 of the first capacitance element C1 is electrically connected to the first DA conversion circuit 30 and the first voltage output circuit 40. The first capacitance element C1 holds the first signal INN. The second capacitance element C2 includes a first terminal Tc21 and a second terminal Tc22. A second signal INP is input to the first terminal Tc21 of the second capacitance element C2. The second terminal Tc22 of the second capacitance element C2 is connected to a first voltage source. The second capacitance element C2 holds the second signal INP. The comparator CMP1 includes a first input terminal Tcmp1 connected to the first terminal Tc11 of the first capacitance element C1 and includes a second input terminal Tcmp2 connected to the first terminal Tc21 of the second capacitance element C2. The comparator CMP1 outputs a signal OUT that represents a result of comparing a first voltage of the first input terminal Tcmp1 with a second voltage of the second input terminal Tcmp2. The first DA conversion circuit 30 includes a plurality of resistance elements R1. When the first capacitance element C1 holds the first signal INN, the first voltage output circuit 40 outputs a third voltage to the second terminal Tc12 of the first capacitance element C1. A first combined resistance value of the first DA conversion circuit 30 and the first voltage output circuit 40 seen from the second terminal Tc12 of the first capacitance element C1 is a first value when the first capacitance element C1 holds the first signal INN. The first combined resistance value of the first DA conversion circuit 30 and the first voltage output circuit 40 seen from the second terminal Tc12 of the first capacitance element C1 is a second value when the comparator CMP1 compares the first voltage with the second voltage. The first value is less than the second value. The first combined resistance value of the first DA conversion circuit 30 and the first voltage output circuit 40 is a resistance value of the circuit in which the first DA conversion circuit 30 and the first voltage output circuit 40 are regarded as one resistor.

A detailed configuration of the AD conversion circuit 10 will be described. As shown in FIG. 1, the first comparison circuit 20 includes the comparator CMP1, the first capacitance element C1, the second capacitance element C2, a first switch SW1, and a second switch SW2.

The first switch SW1 includes a first terminal Tsw11 and a second terminal Tsw12. Ihe first signal INN is input to the first terminal Tsw11 of the first switch SW1. The second terminal Tsw12 of the first switch SW1 is connected to the comparator CMP1 and the first capacitance element C1. The state of the first switch SW1 becomes any one of an ON state and an OFF state. When the first switch SW1 is in the ON state, the first terminal Tsw11 and the second terminal Tsw12 of the first switch SW1 are electrically connected to each other. At this time, the first signal INN is input to the first capacitance element C1. When the first switch SW1 is in OFF state, the first terminal Tsw11 and the second terminal Tsw12 of the first switch SW1 are electrically insulated from each other. When the first switch SW1 is in the ON state, the first switch SW1 samples a voltage of the first signal INN. When the state of the first switch SW1 changes from the ON state to the OFF state, the voltage sampled by the first switch SW1 is held in the first capacitance element C1.

The second switch SW2 includes a first terminal Tsw21 and a second terminal Tsw22. The second signal INP is input to the first terminal Tsw21 of the second switch SW2. The second terminal Tsw22 of the second switch SW2 is connected to the comparator CMP1 and the second capacitance element C2. The state of the second switch SW2 becomes any one of an ON state and an OFF state. When the second switch SW2 is in the ON state, the first terminal Tsw21 and the second terminal Tsw22 of the second switch SW2 are electrically connected to each other. At this time, the second signal INP is input to the second capacitance element C2. When the second switch SW2 is in the OFF state, the first terminal Tsw21 and the second terminal Tsw22 of the second switch SW2 are electrically insulated from each other. When the second switch SW2 is in the ON state, the second switch SW2 samples a voltage of the second signal INP. When the state of the second switch SW2 changes from the ON state to the OFF state, the voltage sampled by the second switch SW2 is held in the second capacitance element C2.

The first capacitance element C1 includes a first terminal Tc11 and a second terminal Tc12. The first terminal Tc11 of the first capacitance element C1 is connected to the second terminal Tsw12 of the first switch SW1. The second terminal Tc12 of the first capacitance element C1 is electrically connected to the first DA conversion circuit 30 and the first voltage output circuit 40. The voltage sampled by the first switch SW1 is input to the first terminal Tc11 of the first capacitance element C1. The first capacitance element C1 holds the voltage sampled by the first switch SW1.

The second capacitance element C2 includes a first terminal Tc21 and a second terminal Tc22. The first terminal Tc21 of the second capacitance element C2 is connected to the second terminal Tsw22 of the second switch SW2. The second terminal Tc22 of the second capacitance element C2 is connected to a ground. The second terminal Tc22 of the second capacitance element C2 may be connected to a voltage source that outputs a reference voltage VREFL or a power source voltage VDD. The voltage sampled by the second switch SW2 is input to the first terminal Tc21 of the second capacitance element C2. The second capacitance element C2 holds the voltage sampled by the second switch SW2.

The comparator CMP1 includes the first input terminal Tcmp1, the second input terminal Tcmp2, and an output terminal Tcmp3. The first input terminal Tcmp1 is an inverting input terminal and the second input terminal Tcmp2 is a non-inverting input terminal. The first input terminal Tcmp1 of the comparator CMP1 is connected to the second terminal Tsw12 of the first switch SW1 and the first terminal Tc11 of the first capacitance element C1. A voltage in accordance with both the voltage held in the first capacitance element C1 and the voltage output from the first DA conversion circuit 30 is input to the first input terminal Tcmp1 of the comparator CMP1. The second input terminal Tcmp2 of the comparator CMP1 is connected to the second terminal Tsw22 of the second switch SW2 and the first terminal Tc21 of the second capacitance element C2. The voltage held in the second capacitance element C2 is input to the second input terminal Tcmp2 of the comparator CMP1.

The comparator CMP1 compares the first voltage of the first input terminal Tcmp1 with the second voltage of the second input terminal Tcmp2. The comparator CMP1 outputs the signal OUT that is based on the comparison result from the output terminal Tcmp3. When the first voltage of the first input terminal Tcmp1 is greater than the second voltage of the second input terminal Tcmp2, the comparator CMP1 outputs one of a high level (H level) and a low level (L level) as the signal OUT. When the first voltage of the first input terminal Tcmp1 is less than the second voltage of the second input terminal Tcmp2, the comparator CMP1 outputs the other of the high level and the low level as the signal OUT. The signal OUT constitutes digital data that are a result of AD conversion.

The first DA conversion circuit 30 includes the plurality of resistance elements R1 and a plurality of third switches SW3. In FIG. 1, reference numerals of three resistance elements R1 and one third switch SW3 are shown as a representative. The plurality of resistance elements R1 constitute an R-2R ladder circuit. The first DA conversion circuit 30 is an R-2R type DA conversion circuit. In the example shown in FIG. 1, the resolution of the first DA conversion circuit 30 is eight bits. The resistance element R1 and the third switch SW3 of the number in accordance with the resolution are disposed.

Each of the third switches SW3 includes an input terminal IN1, an input terminal H, an input terminal L, and an output terminal OUT1. The reference voltage VREFL is input to the input terminal IN1 of the leftmost third switch SW3 in FIG. 1. Signals B0 to B7 are input to the input terminal IN1 of the respective third switches SW3 excluding the leftmost third switch SW3 in FIG. 1. The signal B0 corresponds to a first bit that is the least significant bit (LSB). The signal B7 corresponds to an eighth bit that is the most significant bit (MSB). Voltages of the signals B0 to B7 become any one of the high level and the low level. A reference voltage VREFH is input to the input terminal H of each third switch SW3. For example, the reference voltage VREFH is generated from the power source voltage VDD. The reference voltage VREFL is input to the input terminal L of each third switch SW3. For example, the reference voltage VREFL is generated from a power source voltage VSS. The power source voltage VDD is greater than the power source voltage VSS. The reference voltage VREFH is greater than the reference voltage VREFL. The reference voltage VREFH is less than or equal to the power source voltage VDD. The reference voltage VREFL is greater than or equal to the power source voltage VSS. The output terminal OUT1 of each third switch SW3 is connected to the resistance element R1.

The state of the third switch SW3 becomes any one of a first state and a second state. The state of the third switch SW3 is controlled on the basis of a signal input to the input terminal IN1. When the signal input to the input terminal is at the high level, the third switch SW3 is in the first state. When the signal input to the input terminal IN1 is at the low level, the third switch SW3 is in the second state. When the third switch SW3 is in the first state, the third switch SW3 outputs a voltage input to the input terminal H from the output terminal OUT1. When the third switch SW3 is in the second state, the third switch SW3 outputs a voltage input to the input terminal L from the output terminal OUT1.

The first DA conversion circuit 30 includes an output terminal T30. The output terminal T30 of the first DA conversion circuit 30 is electrically connected to the second terminal Tc12 of the first capacitance element C1. Since the first DA conversion circuit 30 is constituted by the R-2R ladder circuit, the resistance value of the first DA conversion circuit 30 seen from the output terminal T30 is the same as the resistance value of one resistance element R1. The first DA conversion circuit 30 outputs a voltage in accordance with the signals B0 to B7 from the output terminal T30 to the second terminal Tc12 of the first capacitance element C1. The first DA conversion circuit 30 converts the signals B0 to B7 that are digital signals into an analog voltage and outputs the analog voltage from the output terminal T30.

The first voltage output circuit 40 includes a fourth switch SW4. The fourth switch SW4 includes a first terminal Tsw41 and a second terminal Tsw42. The first terminal Tsw41 of the fourth switch SW4 is electrically connected to the second terminal Tc12 of the first capacitance element C1. The reference voltage VREFL is input to the second terminal Tsw42 of the fourth switch SW4. The state of the fourth switch SW4 becomes any one of an ON state and an OFF state. When the fourth switch SW4 is in the ON state, the first terminal Tsw41 and the second terminal Tsw42 of the fourth switch SW4 are electrically connected to each other. When the fourth switch SW4 is in the OFF state, the first terminal Tsw41 and the second terminal Tsw42 of the fourth switch SW4 are electrically insulated from each other.

For example, the fourth switch SW4 is constituted by an NMOS transistor. The configuration of the first voltage output circuit 40 is not limited to the example shown in FIG. 1. The first voltage output circuit 40 may include a plurality of switches. The first voltage output circuit 40 has only to be constituted so as to output the third voltage in accordance with the reference voltage VREFL to the second terminal Tc12 of the first capacitance element C1 when the first capacitance element C1 holds the first signal INN.

The first voltage output circuit 40 includes an output terminal T40. The output terminal T40 of the first voltage output circuit 40 is electrically connected to the second terminal Tc12 of the first capacitance element C1. When the first capacitance element C1 holds the first signal INN, the fourth switch SW4 is in the ON state. At this time, the first voltage output circuit 40 outputs the reference voltage VREFL that is the third voltage from the output terminal T40 to the second terminal Tc12 of the first capacitance element C1. While the first switch SW1 samples the first signal INN and the first capacitance element C1 holds the first signal INN, the voltage of the second terminal Tc12 of the first capacitance element C1 is kept at the reference voltage VREFL. At this time, since the signals B0 to B7 are kept at the low level, the plurality of third switches SW3 of the first DA conversion circuit 30 output the reference voltage VREFL from the output terminal OUT1. For this reason, the first DA conversion circuit 30 outputs the reference voltage VREFL from the output terminal T30.

A control circuit not shown in FIG. 1 controls the signals B0 to B7 on the basis of the signal OUT output from the comparator CMP1.

The resistance value of the first DA conversion circuit 30 seen from the second terminal Tc12 of the first capacitance element C1 is the same as the resistance value of one resistance element R1. In a case in which the first voltage output circuit 40 is not disposed, a time constant $\tau$ of the voltage change of the first terminal Tc11 of the first capacitance element C1 is a product (R1×C1) of the resistance value of the first DA conversion circuit 30 and the capacitance value of the first capacitance element C1. For example, in a case in which the resistance value of the resistance element R1 is 10 [KΩ] and the capacitance value of the first capacitance element C1 is 1 [pF], the time constant $\tau$ is 10 [nsec]. If it is assumed that the length of time required for the first signal INN held in the first capacitance element C1 to stabilize is three times as long as the time constant, the length of time is about 30 [nsec]. The length of time restricts the speed of the AD conversion circuit 10.

The time constant $\tau$ will be described in a case in which the first voltage output circuit 40 is disposed. When the fourth switch SW4 is in the ON state, the first DA conversion circuit 30 and the first voltage output circuit 40 are connected in parallel to the second terminal Tc12 of the first capacitance element C1. It is assumed that the resistance value of the fourth switch SW4 is 100 [Ω]. The resistance value of the first DA conversion circuit 30 is much greater than the resistance value of the fourth switch SW4. For this reason, the combined resistance value of the first DA conversion circuit 30 and the first voltage output circuit 40 is mainly dependent on the resistance value of the fourth switch SW4. When the resistance value of the first DA conversion circuit 30 is neglected, the time constant $\tau$ is a product of the resistance value of the fourth switch SW4 and the capacitance value of the first capacitance element C1. For this reason, the time constant $\tau$ is about 0.1 [nsec]. In other words, the length of time required for sampling and holding the first signal INN is shortened. Consequently, the AD conversion circuit 10 can perform AD conversion at a high speed.

When the comparator CMP1 performs comparison of voltages, the fourth switch SW4 is in the OFF state. For this reason, the first voltage output circuit 40 is electrically insulated from the second terminal Tc12 of the first capacitance element C1. At this time, it is possible to consider the resistance value of the first voltage output circuit 40 seen from the second terminal Tc12 of the first capacitance element C1 to be very large.

In the above-described example, when the first capacitance element C1 holds the first signal INN, the first DA conversion circuit 30 is connected to the second terminal Tc12 of the first capacitance element C1. When the first capacitance element C1 holds the first signal INN, the first DA conversion circuit 30 may be electrically insulated from the second terminal Tc12 of the first capacitance element C1. At this time, it is possible to consider the resistance value of the first DA conversion circuit 30 seen from the second terminal Tc12 of the first capacitance element C1 to be very large.

For example, the range in which the voltage of the first signal INN changes is wider than the range in which the voltage of the second signal INP changes. In other words, when it is assumed that the first voltage output circuit 40 is not disposed, the length of time required for sampling and holding the first signal INN is longer than the length of time required for sampling and holding the second signal INP. Since the length of time required for sampling and holding the first signal INN becomes short, the AD conversion circuit 10 can perform AD conversion at a high speed.

For example, when the fourth switch SW4 is in the ON state, the voltage of the output terminal T30 of the first DA conversion circuit 30 and the voltage of the output terminal T40 of the first voltage output circuit 40 are kept at the reference voltage VREFL. At this time, current does not flow in the fourth switch SW4.

Instead of the fourth switch SW4, a variable resistor may be used. When the first capacitance element C1 holds the first signal INN, the first combined resistance value of the first DA conversion circuit 30 and the variable resistor seen from the second terminal Tc12 of the first capacitance element C1 is a first value. When the comparator CMP1 compares the first voltage with the second voltage, the first combined resistance value of the first DA conversion circuit 30 and the variable resistor seen from the second terminal Tc12 of the first capacitance element C1 is a second value. The resistance value of the variable resistor is set such that the first value is less than the second value. Specifically, the resistance value of the variable resistor when the comparator CMP1 compares the first voltage with the second voltage is greater than the resistance value of the variable resistor when the first capacitance element C1 holds the first signal INN.

An operation of the AD conversion circuit 10 will be described. The operation of the AD conversion circuit 10 is similar to the operation of a general successive approximation register (SAR, in other words sequential comparison) type ADC. The AD conversion circuit 10 causes the amount of the voltage of the output terminal T30 of the first DA conversion circuit 30 to sequentially change from the most significant bit (MSB) side toward the least significant bit (LSB) side. In this way, the voltage of the first terminal Tc11 of the first capacitance element C1 and the voltage of the first input terminal Tcmp1 of the comparator CMP1 change. The AD conversion circuit 10 sequentially compares the amount of the first voltage with the amount of the second voltage. In this way, the AD conversion circuit 10 performs binary search. Consequently, digital data in accordance with the difference between the voltage of the first signal INN and the voltage of the second signal INP are obtained.

Figure 2:
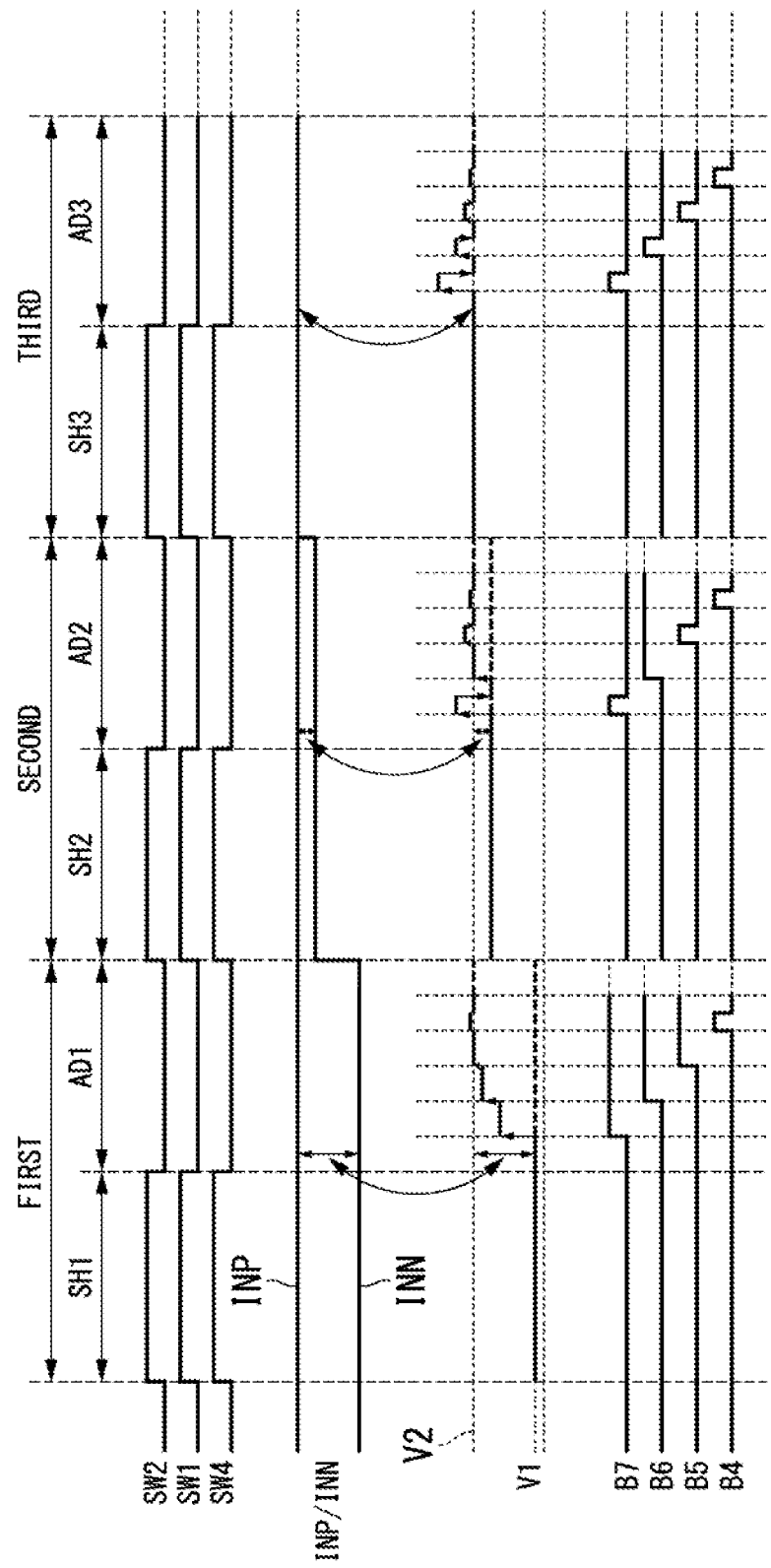
FIG. 2 is a timing chart showing an operation of the AD conversion circuit according to the first embodiment of the present invention.

FIG. 2 shows the operation of the AD conversion circuit 10. In FIG. 2, a waveform of a control signal of each of the second switch SW2, the first switch SW1, and the fourth switch SW4 is shown. In FIG. 2, waveforms of the first signal INN and the second signal INP are shown. In FIG. 2, a waveform of a first voltage V1 of the first input terminal Tcmp1 of the comparator CMP1 is shown. In FIG. 2, waveforms of the signal B7, the signal B6, the signal B5, and the signal B4 are shown. In FIG. 2, waveforms of the signals B3 to B0 are not shown. The horizontal direction in FIG. 2 represents time and the vertical direction in FIG. 2 represents voltage. In FIG. 2, the operation of the AD conversion circuit 10 when the AD conversion circuit 10 sequentially performs AD conversion a plurality of times is shown.

A period in which AD conversion of each time is performed includes a sample-and-hold period and an AD conversion period. Before the first AD conversion is performed, the control signal of each of the second switch SW2, the first switch SW1, and the fourth switch SW4 is at the low level. The period in which the first AD conversion is performed includes a sample-and-hold period SH1 and an AD conversion period AD1.

When the sample-and-hold period SH1 is started, the control signal of each of the second switch SW2, the first switch SW1, and the fourth switch SW4 becomes the high level. In this way, the second switch SW2, the first switch SW1, and the fourth switch SW4 are turned on. Since the first switch SW1 and the second switch SW2 are in the ON state, the first switch SW1 samples the first signal INN and the second switch SW2 samples the second signal INP. Since the fourth switch SW4 is in the ON state, the first voltage output circuit 40 outputs the reference voltage VREFL to the second terminal Tc12 of the first capacitance element C1. Since the signals B0 to B7 are at the low level, the first DA conversion circuit 30 outputs the reference voltage VREFL to the second terminal Tc12 of the first capacitance element C1.

When the sample-and-hold period SH1 is completed, the control signal of each of the second switch SW2, the first switch SW1, and the fourth switch SW4 becomes the low level. In this way, the second switch SW2, the first switch SW1, and the fourth switch SW4 are turned off. Since the first switch SW1 and the second switch SW2 are turned off, the first capacitance element C1 holds the first signal INN and the second capacitance element C2 holds the second signal INP.

After the sample-and-hold period SH1 is completed, the AD conversion period AD1 is started. In the AD conversion period AD1, first, the signal B7 corresponding to the eighth bit that is the MSB becomes the high level. In this way, the third switch SW3, corresponding to the eighth bit, of the first DA conversion circuit 30 outputs the reference voltage VREFH. The voltage of the output terminal T30 of the first DA conversion circuit 30 changes on the basis of switching of the third switch SW3. Due to the change of the voltage of the output terminal T30 of the first DA conversion circuit 30, the first voltage V1 of the first input terminal Tcmp1 of the comparator CMP1 changes.

The comparator CMP1 compares the first voltage V1 of the first input terminal Tcmp1 with a second voltage V2 of the second input terminal Tcmp2. In the example shown in FIG. 2, in AD conversion of a plurality of times, the voltage of the second signal INP is almost the same. In FIG. 2, the second voltage V2 of the second input terminal Tcmp2 is shown. The second voltage V2 is greater than the first voltage V1.

At this time, the signal B6 corresponding to the seventh bit becomes the high level on the basis of the signal OUT output from the comparator CMP1. The signal B7 is kept at the high level. In this way, the third switch SW3, corresponding to the seventh bit, of the first DA conversion circuit 30 outputs the reference voltage VREFH. Thereafter, an operation similar to the above-described operation is performed.

After the signal B6 becomes the high level, the second voltage V2 is greater than the first voltage V1. For this reason, the signal B5 corresponding to the sixth bit becomes the high level on the basis of the signal OUT output from the comparator CMP1. The signal B7 and the signal B6 are kept at the high level. In this way, the third switch SW3, corresponding to the sixth bit, of the first DA conversion circuit 30 outputs the reference voltage VREFH. Thereafter, an operation similar to the above-described operation is performed.

After the signal B5 becomes the high level, the second voltage V2 is greater than the first voltage V1. For this reason, the signal B4 corresponding to the fifth bit becomes the high level on the basis of the signal OUT output from the comparator CMP1. The signal B7, the signal B6, and the signal B5 are kept at the high level. In this way, the third switch SW3, corresponding to the fifth bit, of the first DA conversion circuit 30 outputs the reference voltage VREFH. Thereafter, an operation similar to the above-described operation is performed.

After the signal B4 becomes the high level, the second voltage V2 is less than the first voltage V1. For this reason, the signal B4 corresponding to the fifth bit becomes the low level on the basis of the signal OUT output from the comparator CMP1. Thereafter, the signal B3 corresponding to the fourth bit becomes the high level and an operation similar to the above-described operation is repeated. The operation that is based on the signals B3 to B0 will not be described.

When the operation that is based on the signal B0 is completed, the AD conversion period AD1 is completed. After the AD conversion period AD1 is completed, the second AD conversion is performed. The period in which the second AD conversion is performed includes a sample-and-hold period SH2 and an AD conversion period AD2. An operation in the sample-and-hold period SH2 is similar to the operation in the sample-and-hold period SH1. An operation in the AD conversion period AD2 is similar to the operation in the AD conversion period AD1.

After the AD conversion period AD2 is completed, the third AD conversion is performed. The period in which the third AD conversion is performed includes a sample-and-hold period SH3 and an AD conversion period AD3. An operation in the sample-and-hold period SH3 is similar to the operation in the sample-and-hold period SH1. An operation in the AD conversion period AD3 is similar to the operation in the AD conversion period AD1. An operation after the AD conversion period AD3 is completed will not be described.

As described above, when the first capacitance element C1 holds the first signal INN, the first combined resistance value of the first DA conversion circuit 30 and the first voltage output circuit 40 seen from the second terminal Tc12 of the first capacitance element C1 becomes small. For this reason, the length of time required for sampling and holding the first signal INN is shortened. In this way, the AD conversion circuit 10 can shorten the processing time of AD conversion.

First Modified Example of First Embodiment

Figure 3:
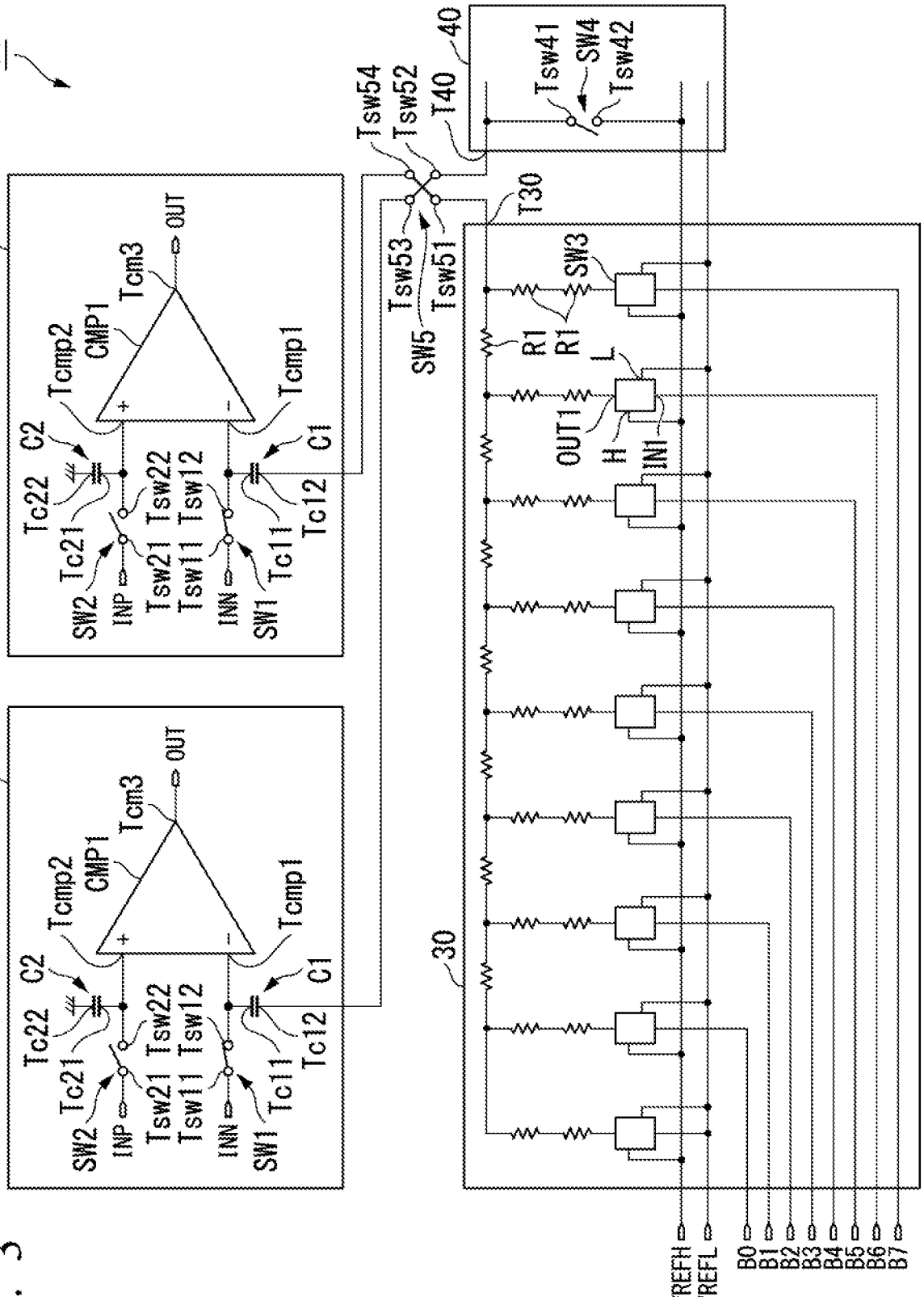
FIG. 3 is a circuit diagram showing a configuration of an AD conversion circuit according to a first modified example of the first embodiment of the present invention.

FIG. 3 shows a configuration of an AD conversion circuit 11 according to a first modified example of the first embodiment of the present invention. In terms of the configuration shown in FIG. 3, points different from the configuration shown in FIG. 1 will be described.

As shown in FIG. 3, the AD conversion circuit 11 includes a second comparison circuit 21 and a fifth switch SW5 in addition to the configuration shown in FIG. 1. The second comparison circuit 21 is constituted similarly to the first comparison circuit 20.

The fifth switch SW5 includes a first terminal Tsw51 a second terminal Tsw52, a third terminal Tsw53, and a fourth terminal Tsw54. The first terminal Tsw51 of the fifth switch SW5 is connected to the output terminal T30 of the first DA conversion circuit 30. The second terminal Tsw52 of the fifth switch SW5 is connected to the output terminal T40 of the first voltage output circuit 40. The third terminal Tsw53 of the fifth switch SW5 is connected to the second terminal Tc12 of the first capacitance element C1 of the first comparison circuit 20. The fourth terminal Tsw54 of the fifth switch SW5 is connected to the second terminal TC12 of the first capacitance element C1 of the second comparison circuit 21.

The state of the fifth switch SW5 becomes any one of a first state and a second state. When the fifth switch SW5 is in the first state, the first terminal Tsw51 of the fifth switch SW5 and the fourth terminal Tsw54 of the fifth switch SW5 are electrically connected to each other. In addition, the second terminal Tsw52 of the fifth switch SW5 and the third terminal Tsw53 of the fifth switch SW5 are electrically connected to each other. When the fifth switch SW5 is in the second state, the first terminal Tsw51 of the fifth switch SW5 and the third terminal Tsw53 of the fifth switch SW5 are electrically connected to each other. In addition, the second terminal Tsw52 of the fifth switch SW5 and the fourth terminal Tsw54 of the fifth switch SW5 are electrically connected to each other.

When the fifth switch SW5 is in the first state, the second terminal Tc12 of the first capacitance element C1 of the first comparison circuit 20 is electrically connected to the first voltage output circuit 40 and the second terminal Tc12 of the first capacitance element C1 of the second comparison circuit 21 is electrically connected to the first DA conversion circuit 30. At this time, the first comparison circuit 20 samples and holds the first signal INN and the second signal INP. In addition, the second comparison circuit 21 compares the first voltage of the first input terminal Tcmp1 of the comparator CMP1 with the second voltage of the second input terminal Tcmp2 of the comparator CMP1.

When the fifth switch SW5 is in the second state, the second terminal Tc12 of the first capacitance element C1 of the first comparison circuit 20 is electrically connected to the first DA conversion circuit 30 and the second terminal Tc12 of the first capacitance element C1 of the second comparison circuit 21 is electrically connected to the first voltage output circuit 40. At this time, the first comparison circuit 20 compares the first voltage of the first input terminal Tcmp1 of the comparator CMP1 with the second voltage of the second input terminal Tcmp2 of the comparator CMP1. In addition, the second comparison circuit 21 samples and holds the first signal INN and the second signal INP.

In terms of points other than the above, the configuration shown in FIG. 3 is similar to the configuration shown in FIG. 1.

As described above, when the first comparison circuit 20 samples and holds a signal, the second comparison circuit 21 compares voltages. In addition, when the first comparison circuit 20 compares voltages, the second comparison circuit 21 samples and holds a signal. Therefore, the AD conversion circuit 11 can perform an interleave operation. Consequently, the AD conversion circuit 11 can perform AD conversion at a high speed.

The first comparison circuit 20 and the second comparison circuit 21 share the first DA conversion circuit 30 and the first voltage output circuit 40. Therefore, the increase in the area of the AD conversion circuit 11 is suppressed.

Second Modified Example of First Embodiment

Figure 4:
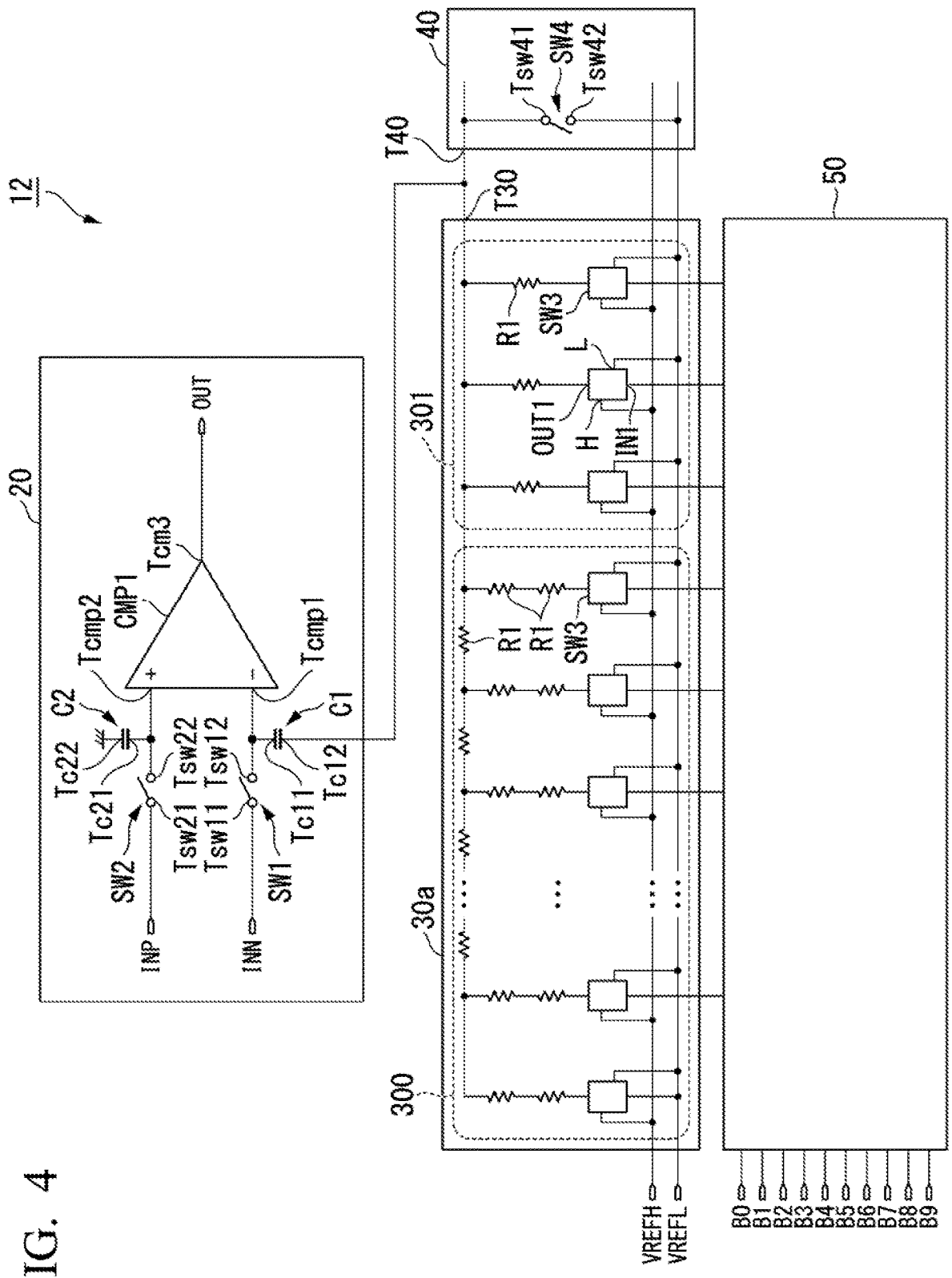
FIG. 4 is a circuit diagram showing a configuration of an AD conversion circuit according to a second modified example of the first embodiment of the present invention.

FIG. 4 shows a configuration of an AD conversion circuit 12 according to a second modified example of the first embodiment of the present invention. In terms of the configuration shown in FIG. 4, points different from the configuration shown in FIG. 1 will be described.

As shown in FIG. 4, the AD conversion circuit 12 includes a switch control circuit 50 in addition to the configuration shown in FIG. 1. In the AD conversion circuit 12, the first DA conversion circuit 30 shown in FIG. 1 is changed to a first DA conversion circuit 30a.

The first DA conversion circuit 30a includes a first circuit 300 and a second circuit 301. The first circuit 300 is similar to the circuit constituted by the plurality of resistance elements R1 and the plurality of third, switches SW3 in the first DA conversion circuit 30 shown in FIG. 1. The second circuit 301 includes a plurality of resistance elements R1 and a plurality of third switches SW3. The plurality of resistance elements R1 of the second circuit 301 are connected in parallel to each other. The second circuit 301 is a resistance-parallel type DA conversion circuit. In other words, the first DA conversion circuit 30a is a combination of the R-2R type DA conversion circuit and the resistance-parallel type DA conversion circuit. In the example shown in FIG. 4, the resolution of the first DA conversion circuit 30a is ten bits. The first circuit 300 corresponds to the lower eight bits. The second circuit 301 corresponds to the upper two bits.

The switch control circuit 50 generates a control signal on the basis of signals B0 to B9. The control signal generated by the switch control circuit 50 is input to the input terminal IN1 of the plurality of third switches SW3 of the first DA conversion circuit 30a. The plurality of third switches SW3 are controlled on the basis of this control signal.

In terms of points other than the above, the configuration shown in FIG. 4 is similar to the configuration shown in FIG. 1.

As described above, at least part of the plurality of resistance elements R1 included in the first DA conversion circuit 30a constitute the R-2R ladder circuit. In this way, the increase in the area of the first DA conversion circuit 30a can be suppressed.

Second Embodiment

Figure 5:
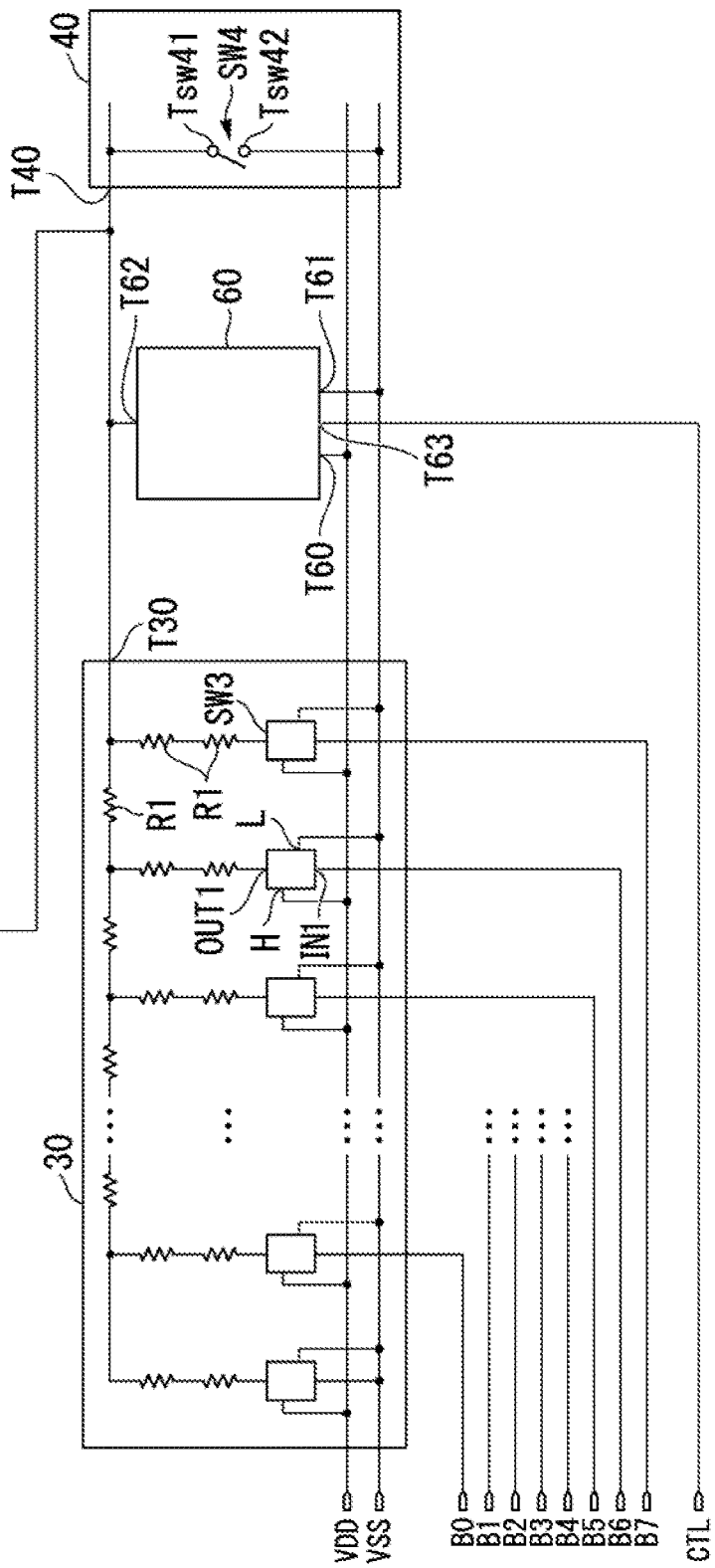
FIG. 5 is a circuit diagram showing a configuration of an AD conversion circuit according to a second embodiment of the present invention.

FIG. 5 shows a configuration of an AD conversion circuit 13 according to a second embodiment of the present invention. In terms of the configuration shown in FIG. 5, points different from the configuration shown in FIG. 1 will be described. As shown in FIG. 5, the AD conversion circuit 13 includes an adjustment circuit 60 in addition to the configuration shown in FIG. 1.

The adjustment circuit 60 includes a first terminal T60, a second terminal T61, a third terminal T62, and a fourth terminal T63. The power source voltage VDD is input to the first terminal T60 of the adjustment circuit 60. The power source voltage VSS is input to the second terminal T61 of the adjustment circuit 60. The third terminal T62 of the adjustment circuit 60 is electrically connected to the output terminal T30 of the first DA conversion circuit 30 and the second terminal Tc12 of the first capacitance element C1. The adjustment circuit 60 outputs a voltage in accordance with the power source voltage VDD, the power source voltage VSS, and the resistance value of the first DA conversion circuit 30 from the third terminal T62 to the second terminal Tc12 of the first capacitance element C1. In this way, the adjustment circuit 60 adjusts a full-scale range of the first DA conversion circuit 30. The voltage output from the third terminal T62 of the adjustment circuit 60 is greater than or equal to the power source voltage VSS and less than or equal to the power source voltage VDD. A control signal CTL is input to the fourth terminal T63 of the adjustment circuit 60. The adjustment circuit 60 controls the voltage output from the third terminal T62 on the basis of the control signal CTL.

In the first DA conversion circuit 30, the power source voltage VSS is input to the input terminal IN1 of the leftmost third switch SW3 in FIG. 5. Signals B0 to B7 are input to the input terminal IN1 of the respective third switches SW3 excluding the leftmost third switch SW3 in FIG. 5. The power source voltage VDD is input to the input terminal H of each third switch SW3. The power source voltage VSS is input to the input terminal L of each third switch SW3. In the first voltage output circuit 40, the power source voltage VSS is input to the second terminal Tsw42 of the fourth switch SW4.

In terms of points other than the above, the configuration shown in FIG. 5 is similar to the configuration shown in FIG. 1.

The adjustment circuit 60 may be disposed inside the first DA conversion circuit 30. At least one of the AD conversion circuit 11 shown in FIG. 3 and the AD conversion circuit 12 shown in FIG. 4 may include the adjustment circuit 60.

As described above, the AD conversion circuit 13 includes the adjustment circuit 60 that adjusts the full-scale range of the first DA conversion circuit 30. For this reason, two reference voltages supplied to the first DA conversion circuit 30 can be the power source voltage VDD and the power source voltage VSS. Therefore, a circuit that generates the reference voltage VREFH and the reference voltage VREFL is unnecessary.

Third Embodiment

Figure 6:
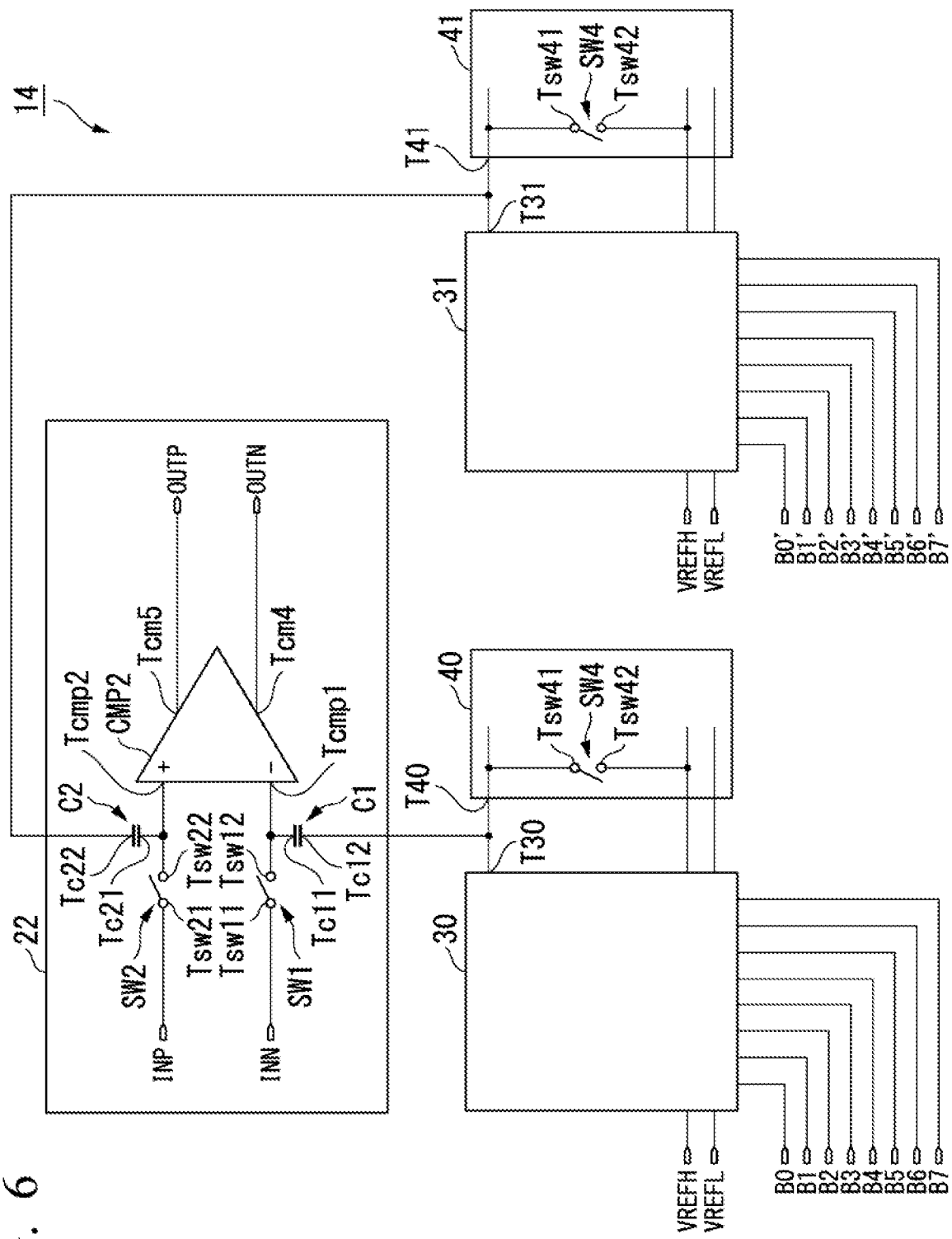
FIG. 6 is a circuit diagram showing a configuration of an AD conversion circuit according to a third embodiment of the present invention.

FIG. 6 shows a configuration of an AD conversion circuit 14 according to a third embodiment of the present invention. In terms of the configuration shown in FIG. 6, points different from the configuration shown in FIG. 1 will be described. As shown in FIG. 6, the AD conversion circuit 14 includes a second DA conversion circuit 31 and a second voltage output circuit 41 in addition to the configuration shown in FIG. 1. In the AD conversion circuit 14, the comparator CMP1 shown in FIG. 1 is changed to a comparator CMP2.

The comparator CMP2 includes a first input terminal Tcmp1, a second input terminal Tcmp2, a first output terminal Tcmp4, and a second output terminal Tcmp5. The first input terminal Tcmp1 and the second input terminal Tcmp2 of the comparator CMP2 are constituted similarly to the first input terminal Tcmp1 and the second input terminal Tcmp2 of the comparator CMP1 shown in FIG. 1, respectively.

The comparator CMP2 compares a first voltage of the first input terminal Tcmp1 with a second voltage of the second input terminal Tcmp2. The comparator CMP2 outputs a signal OUTN that is based on the comparison result from the first output terminal Tcmp4 and outputs a signal OUTP that is based on the comparison result from the second output terminal Tcmp5. When the first voltage of the first input terminal Tcmp1 is greater than the second voltage of the second input terminal Tcmp2, the comparator CMP2 outputs one of the high level and the low level as the signal OUTN. When the first voltage of the first input terminal Tcmp1 is less than the second voltage of the second input terminal Tcmp2, the comparator CMP2 outputs the other of the high level and the low level as the signal OUTN. The signal OUTP is a signal generated by inverting the signal OUTN. The signal OUTN and the signal OUTP constitute digital data that are a result of AD conversion.

The second DA conversion circuit 31 is constituted similarly to the first DA conversion circuit 30. In other words, the second DA conversion circuit 31 includes a plurality of resistance elements R1. The second voltage output circuit 41 is constituted similarly to the first voltage output circuit 40. The second terminal Tc22 of the second capacitance element C2 is electrically connected to the second DA conversion circuit 31 and the second voltage output circuit 41. When the second capacitance element C2 holds the second signal INP, the second voltage output circuit 41 outputs a fourth voltage to the second terminal Tc22 of the second capacitance element C2. A second combined resistance value of the second DA conversion circuit 31 and the second voltage output circuit 41 seen from the second terminal Tc22 of the second capacitance element C2 is a third value when the second capacitance element C2 holds the second signal INP. The second combined resistance value of the second DA conversion circuit 31 and the second voltage output circuit 41 seen from the second terminal Tc22 of the second capacitance element C2 is a fourth value when the comparator CMP2 compares the first voltage with the second voltage. The third value is less than the fourth value. The second combined resistance value of the second DA conversion circuit 31 and the second voltage output circuit 41 is a resistance value of the circuit in which the second DA conversion circuit 31 and the second voltage output circuit 41 are regarded as one resistor.

In the first DA conversion circuit 30 and the second DA conversion circuit 31, the reference voltage VREFH is input to the input terminal IN1 of the leftmost third switch SW3 not shown in FIG. 6.

The second DA conversion circuit 31 includes an output terminal T31. The output terminal T31 of the second DA conversion circuit 31 is electrically connected to the second terminal Tc22 of the second capacitance element C2. Since the second DA conversion circuit 31 is constituted by the R-2R ladder circuit, the resistance value of the second DA conversion circuit 31 seen from the output terminal T31 is the same as the resistance value of one resistance element R1. Signals B0' to B7' corresponding to the signals B0 to B7 are input to the second DA conversion circuit 31. The signals B0' to B7' are not necessarily the same as the signals B0 to B7. The second DA conversion circuit 31 outputs a voltage in accordance with the signals B0' to B7' from the output terminal T31 to the second terminal Tc22 of the second capacitance element C2. The second DA conversion circuit 31 converts the signals B0' to B7' that are digital signals into an analog voltage and outputs the analog voltage from the output terminal T31.

The second voltage output circuit 41 includes an output terminal T41. The output terminal T41 of the second voltage output circuit 41 is electrically connected to the second terminal Tc22 of the second capacitance element C2. When the second capacitance element C2 holds the second signal INP, the fourth switch SW4 of the second voltage output circuit 41 is in the ON state. At this time, the second voltage output circuit 41 outputs the reference voltage VREFH that is the fourth voltage from the output terminal T41 to the second terminal Tc22 of the second capacitance element C2. While the second switch SW2 samples the second signal INP and the second capacitance element C2 holds the second signal INP, the voltage of the second terminal Tc22 of the second capacitance element C2 is kept at the reference voltage VREFH. At this time, since the signals B0' to B7' are kept at the high level, the plurality of third switches SW3 of the second DA conversion circuit 31 output the reference voltage VREFH from the output terminal OUT1. For this reason, the second DA conversion circuit 31 outputs the reference voltage VREFH from the output terminal T31. The second voltage output circuit 41 is electrically insulated from the second terminal Tc22 of the second capacitance element C2 when the comparator CMP2 compares the first voltage with the second voltage. The resistance value of the second voltage output circuit 41 when the comparator CMP2 compares the first voltage with the second voltage is greater than the resistance value of the second voltage output circuit 41 when the second capacitance element C2 holds the second signal INP.

A control circuit not shown in FIG. 6 controls the signals B0 to B7 and the signals B0' to B7' on the basis of the signal OUTN and the signal OUTP output from the comparator CMP2.

The AD conversion circuit 14 is a differential type AD conversion circuit. The operation performed by the AD conversion circuit 14 is similar to the operation disclosed in Non-Patent Literature 1.

The second voltage output circuit 41 is constituted similarly to the first voltage output circuit 40 and operates similarly to the first voltage output circuit 40. For this reason, the length of time required for sampling and holding the second signal INP is shortened. In this way, the AD conversion circuit 14 can perform AD conversion at a high speed.

Fourth Embodiment

Figure 7:
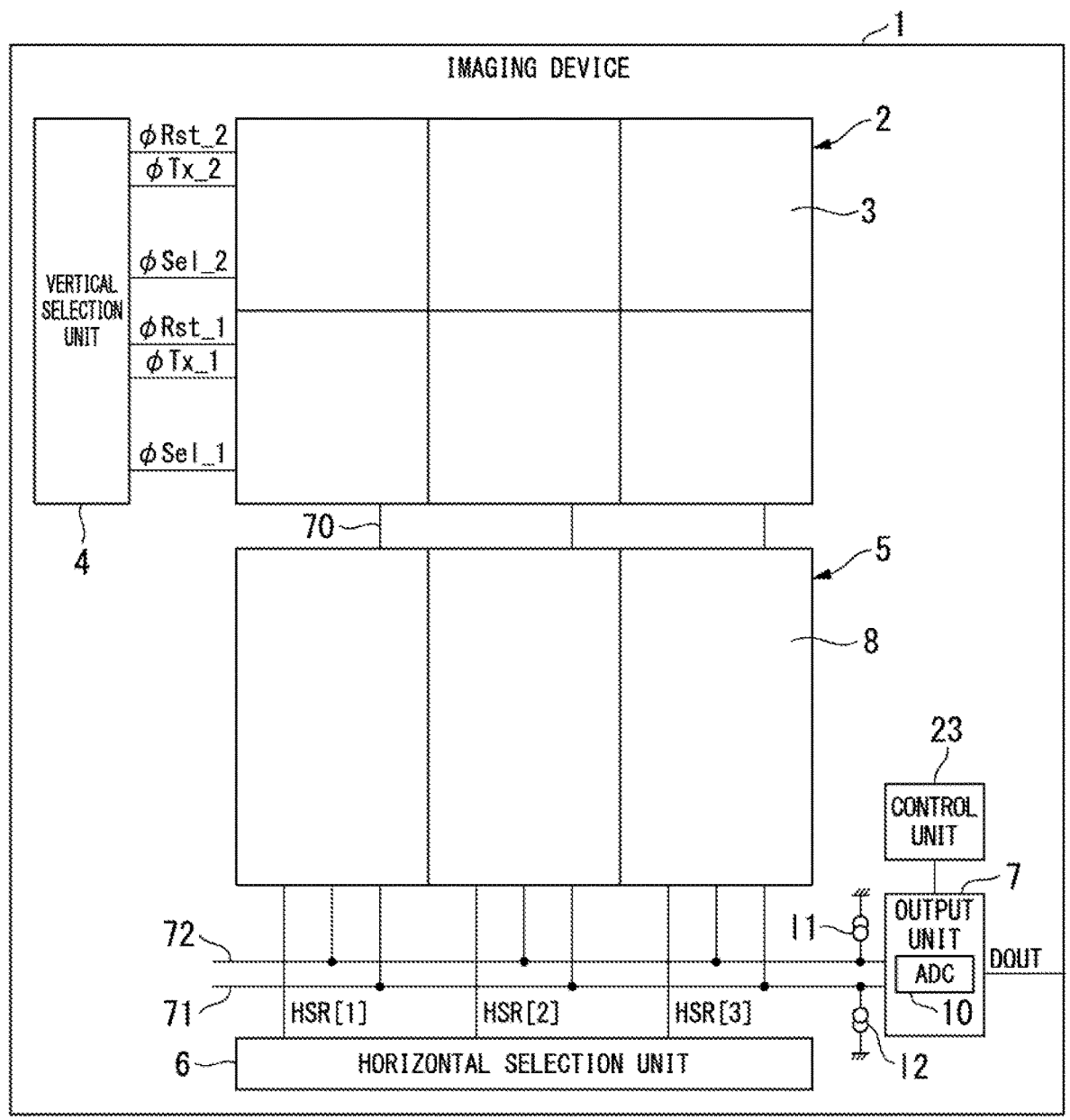
FIG. 7 is a block diagram showing a configuration of an imaging device according to a fourth embodiment of the present invention.

FIG. 7 shows a configuration of an imaging device 1 according to a fourth embodiment of the present invention. As shown in FIG. 7, the imaging device 1 includes an imaging unit 2, a vertical selection unit 4, a column circuit unit 5, a horizontal selection unit 6, an output unit 7, and a control unit 23. For example, the imaging unit 2, the vertical selection unit 4, the column circuit unit 5, the horizontal selection unit 6, the output unit 7, and the control unit 23 are disposed in the same substrate. When a chip in which the imaging device 1 is disposed includes a plurality of substrates, the imaging unit 2, the vertical selection unit 4, the column circuit unit 5, the horizontal selection unit 6, the output unit 7, and the control unit 23 may be distributed to the plurality of substrates.

The imaging unit 2 includes a plurality of pixels 3 disposed in a matrix shape. The plurality of pixels 3 constitute an array having in rows and n columns, m and n are integers of two or more. The number of rows and the number of columns may not be the same. In FIG. 7, an example in which the number of rows is two and the number of columns is three is shown. This is only an example and the present invention is not limited to this. The pixel 3 outputs a first pixel signal having a signal level and a second pixel signal having a reset level.

The vertical selection unit 4 selects the pixel 3 disposed in the row direction in the array of the plurality of pixels 3.

The vertical selection unit 4 controls an operation of the selected pixel 3. The vertical selection unit 4 outputs control signals for controlling the plurality of pixels 3 for each row in the array of the plurality of pixels 3. The control signals output from the vertical selection unit 4 include a transfer pulse φTx_i, a reset pulse φRst_i, and a selection pulse φSel_i, i is one or two. In FIG. 7, the transfer pulse φTx_1, the reset pulse φRst_1, and the selection pulse φSel_1 are output to the pixels 3 of the first row. In FIG. 7, the transfer pulse φTx_2, the reset pulse φRst_2, and the selection pulse φSel_2 are output to the pixels 3 of the second row.

The column circuit unit 5 includes a plurality of column circuits 8. The column circuit 8 is disposed for each column in the array of the plurality of pixels 3. The column circuit 8 is connected to a vertical signal line 70 extending in the vertical direction, i.e., the column direction. The vertical signal line 70 is disposed for each column in the array of the plurality of pixels 3. The vertical signal line 70 is connected to the pixels 3 of each column. The column circuit 8 is electrically connected to the pixels 3 through the vertical signal line 70. The column circuit 8 generates a first signal in accordance with the first pixel signal of the signal level output from the pixel 3 and a second signal in accordance with the second pixel signal of the reset level output from the pixel 3.

The column circuit 8 is connected to a first horizontal signal line 71 and a second horizontal signal line 72 extending in the horizontal direction, i.e., the row direction. A selection pulse HSR[k] is output from the horizontal selection unit 6 to the column circuit 8 corresponding to a column k. k is any one of one, two, and three. The column circuit 8 selected on the basis of the selection pulse HSR[k] outputs the first signal to the first horizontal signal line 71 and outputs the second signal to the second horizontal signal line 72.

One column circuit 8 may be disposed for a plurality of columns in the array of the plurality of pixels 3 and one column circuit 8 may be used in the plurality of columns in a time-division manner. Therefore, the column circuit 8 has only to be disposed so as to correspond to one or more columns in the array of the plurality of pixels 3.

The first horizontal signal line 71 and the second horizontal signal line 72 are connected to the output unit 7. A first current source I1 is connected to the first horizontal signal line 71 and a second current source I2 is connected to the second horizontal signal line 72. The horizontal selection unit 6 sequentially selects the column circuits 8 by using the selection pulses HSR[1] to HSR[3]. The first signal and the second signal output from the column circuit 8 selected by the horizontal selection unit 6 are transferred to the output unit 7.

The output unit 7 includes the AD conversion circuit 10 shown in FIG. 1. In the AD conversion circuit 10, the first terminal Tsw11 of the first switch SW1 is connected to the first horizontal signal line 71 and the first terminal Tsw21 of the second switch SW2 is connected to the second horizontal signal line 72. The AD conversion circuit 10 generates digital data DOUT in accordance with the first signal and the second signal. The output unit 7 outputs the digital data DOUT to a subsequent-stage circuit.

The control unit 23 is a control circuit that controls the AD conversion circuit 10. The control unit 23 generates the signals B0 to B7 on the basis of the signal OUT output from the comparator CMP1 of the AD conversion circuit 10. The control unit 23 outputs the generated signals B0 to B7 to the output unit 7.

Figure 8:
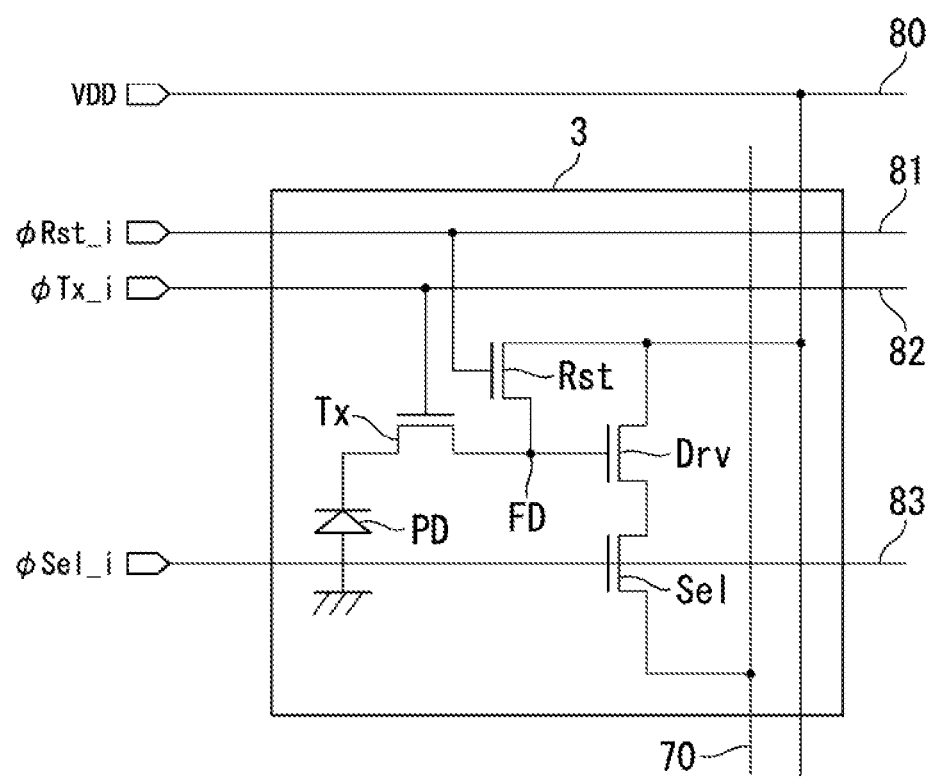
FIG. 8 is a circuit diagram showing a configuration of a pixel according to the fourth embodiment of the present invention.

FIG. 8 shows a configuration of the pixel 3. As shown in FIG. 8, the pixel 3 includes a photoelectric conversion unit PD, a transfer transistor Tx, a charge storage portion FD, a reset transistor Rst, an amplification transistor Drv, and a selection transistor Sel. Each transistor shown in FIG. 8 is an NMOS transistor. Each transistor shown in FIG. 8 includes a gate terminal, a source terminal, and a drain terminal.

For example, the photoelectric conversion unit PD is a photodiode. The photoelectric conversion unit PD includes a first terminal and a second terminal. The first terminal of the photoelectric conversion unit PD is connected to the ground. The second terminal of the photoelectric conversion unit PD is connected to the transfer transistor Tx.

The source terminal of the transfer transistor Tx is connected to the second terminal of the photoelectric conversion unit PD. The drain terminal of the transfer transistor Tx is connected to the charge storage portion FD. The gate terminal of the transfer transistor Tx is connected to a control signal line 82. The control signal line 82 extends from the vertical selection unit 4 in the row direction in the array of the plurality of pixel 3. The control signal line 82 transmits the transfer pulse φTx_i.

The drain terminal of the reset transistor Rst is connected to a power source line 80. The power source line 80 is connected to a power source that outputs a power source voltage VDD. The source terminal of the reset transistor Rst is connected to the charge storage portion FD. The gate terminal of the reset transistor Rst is connected to a control signal line 81. The control signal line 81 extends from the vertical selection unit 4 in the row direction in the array of the plurality of pixels 3. The control signal line 81 transmits the reset pulse φRst_i.

The drain terminal of the amplification transistor Drv is connected to the power source line 80. The source terminal of the amplification transistor Drv is connected to the selection transistor Sel. The gate terminal of the amplification transistor Drv is connected to the charge storage portion FD.

The drain terminal of the selection transistor Sel is connected to the source terminal of the amplification transistor Drv. The source terminal of the selection transistor Sel is connected to the vertical signal line 70. The gate terminal of the selection transistor Sel is connected to a control signal line 83. The control signal line 83 extends from the vertical selection unit 4 in the row direction in the array of the plurality of pixels 3. The control signal line 83 transfers the selection pulse φSel_i.

The transfer transistor Tx is controlled on the basis of the transfer pulse φTx_i output from the vertical selection unit 4. The transfer transistor Tx of the pixel 3 of the first row is controlled on the basis of the transfer pulse φTx_1 and the transfer transistor Tx of the pixel 3 of the second row is controlled on the basis of the transfer pulse φTx_2. The reset transistor Rst is controlled on the basis of the reset pulse φRst_i output from the vertical selection unit 4. The reset transistor Rst of the pixel 3 of the first row is controlled on the basis of the reset pulse φRst_1 and the reset transistor Rst of the pixel 3 of the second row is controlled on the basis of the reset pulse φRst_2. The selection transistor Sel is controlled on the basis of the selection pulse φSel_i output from the vertical selection unit 4. The selection transistor Sel of the pixel 3 of the first row is controlled on the basis of the selection pulse φSel_1 and the selection transistor Sel of the pixel 3 of the second row is controlled on the basis of the selection pulse φSel_2.

The photoelectric conversion unit PD generates signal charge in accordance with the amount of incident light. The transfer transistor Tx transfers the signal charge generated by the photoelectric conversion unit PD to the charge storage portion FD. For example, the charge storage portion FD is a floating diffusion. The charge storage portion FD stores the signal charge transferred by the transfer transistor Tx. The reset transistor Rst resets the charge storage portion FD to a predetermined voltage. The amplification transistor Drv generates a pixel signal by amplifying a signal in accordance with a voltage of the charge storage portion FD. The selection transistor Sel outputs the pixel signal to the vertical signal line 70. The vertical signal line 70 is disposed for each column in the array of the plurality of pixels 3. The first pixel signal having the signal level and the second pixel signal having the reset level are output from the pixel 3.

Figure 9:
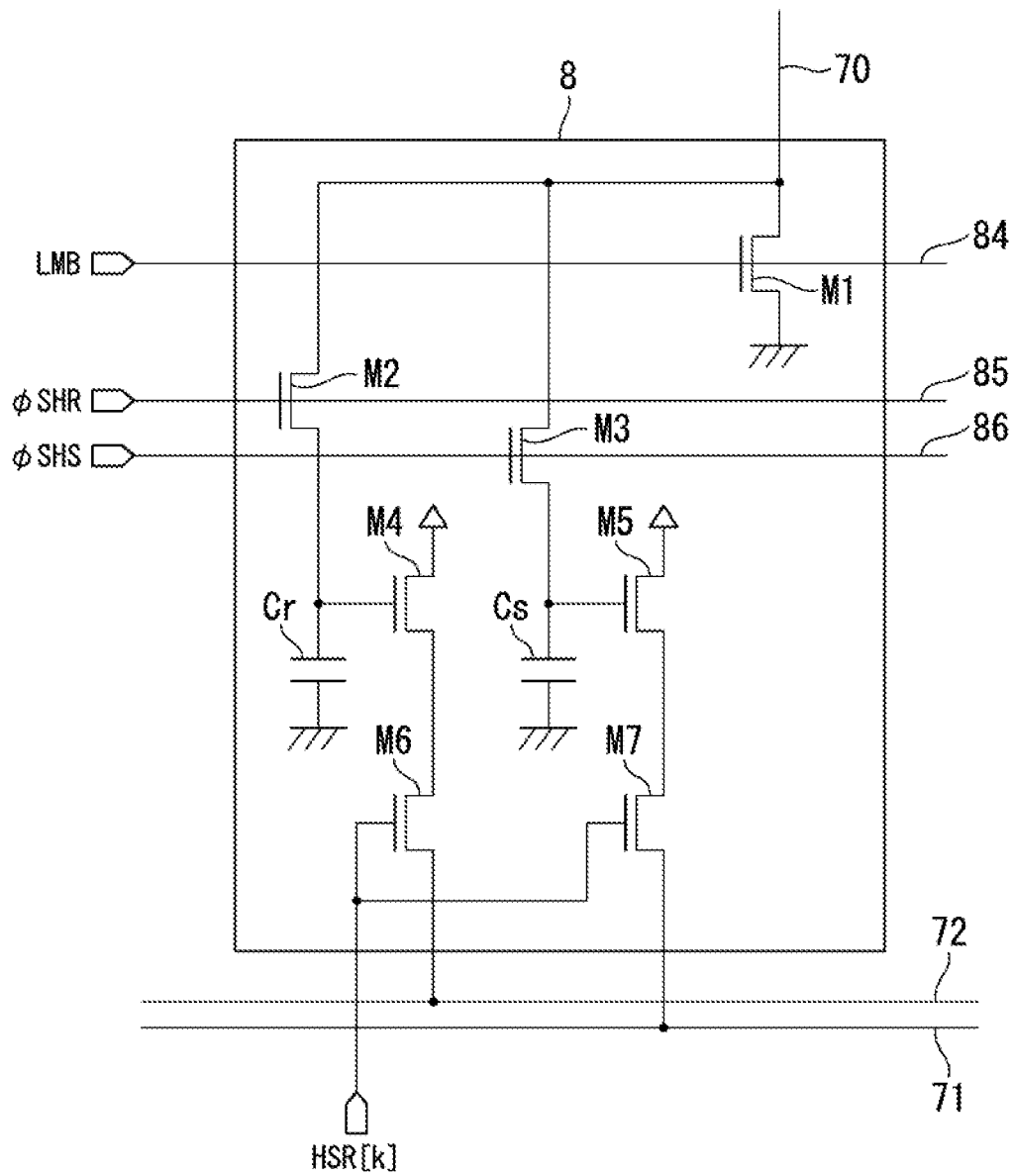
FIG. 9 is a circuit diagram showing a configuration of a column circuit according to the fourth embodiment of the present invention.

FIG. 9 shows a configuration of the column circuit 8. As shown in FIG. 9, the column circuit 8 includes a transistor M1, a sample transistor M2, a sample transistor M3, an amplification transistor M4, an amplification transistor M5, a column selection transistor M6, a column selection transistor M7, a capacitance element Cr, and a capacitance element Cs. Each transistor shown in FIG. 9 is an NMOS transistor. Each transistor shown in FIG. 9 includes a gate terminal, a source terminal, and a drain terminal.

The drain terminal of the transistor M1 is connected to the vertical signal line 70. The source terminal of the transistor M1 is connected to the ground. The gate terminal of the transistor M1 is connected to a power source line 84. The power source line 84 is connected to a power source that outputs a predetermined voltage LMB.

The drain terminal of the sample transistor M2 is connected to the vertical signal line 70. The source terminal of the sample transistor M2 is connected to the capacitance element Cr. The gate terminal of the sample transistor M2 is connected to a control signal line 85. The control signal line 85 extends in the row direction in the array of the plurality of pixels 3. The control signal line 85 transfers a sample-and-hold pulse φSHR.

The drain terminal of the sample transistor M3 is connected to the vertical signal line 70. The source terminal of the sample transistor M3 is connected to the capacitance element Cs. The gate terminal of the sample transistor M3 is connected to a control signal line 86. The control signal line 86 extends in the row direction in the array of the plurality of pixels 3. The control signal line 86 transfers a sample-and-hold pulse φSHS.

The capacitance element Cr and the capacitance element Cs include a first terminal and a second terminal. The first terminal of the capacitance element Cr is connected to the source terminal of the sample transistor M2. The second terminal of the capacitance element Cr is connected to the ground. The first terminal of the capacitance element Cs is connected to the source terminal of the sample transistor M3. The second terminal of the capacitance element Cs is connected to the ground.

The power source voltage VDD is input to the drain terminal of the amplification transistor M4. The source terminal of the amplification transistor M4 is connected to the column selection transistor M6. The gate terminal of the amplification transistor M4 is connected to the first terminal of the capacitance element Cr.

The power source voltage VDD is input to the drain terminal of the amplification transistor M5. The source terminal of the amplification transistor M5 is connected to the column selection transistor M7. The gate terminal of the amplification transistor M5 is connected to the first terminal of the capacitance element Cs.

The drain terminal of the column selection transistor M6 is connected to the source terminal of the amplification transistor M4. The source terminal of the column selection transistor M6 is connected to the second horizontal signal line 72. The gate terminal of the column selection transistor M6 is connected to the horizontal selection unit 6.

The drain terminal of the column selection transistor M7 is connected to the source terminal of the amplification transistor M5. The source terminal of the column selection transistor M7 is connected to the first horizontal signal line 71. The gate terminal of the column selection transistor M7 is connected to the horizontal selection unit 6.

An operation of the sample transistor M2 is controlled on the basis of the sample-and-hold pulse φSHR. An operation of the sample transistor M3 is controlled on the basis of the sample-and-hold pulse φSHS. Operations of the column selection transistor M6 and the column selection transistor M7 are controlled on the basis of the selection pulse HSR[k] output from the horizontal selection unit 6. k is any one of one, two, and three.

The transistor M1 functions as a current source. The sample transistor M2 samples the second pixel signal of the reset level output from the pixel 3 to the vertical signal line 70. The sample transistor M3 samples the first pixel signal of the signal level output from the pixel 3 to the vertical signal line 70. The capacitance element Cr holds the second pixel signal of the reset level sampled by the sample transistor M2. The capacitance element Cs holds the first pixel signal of the signal level sampled by the sample transistor M3. The capacitance element Cr and the capacitance element Cs are sample capacitors.

The amplification transistor M4 generates the second signal by amplifying the second pixel signal of the reset level held in the capacitance element Cr. In other words, the amplification transistor M4 generates the second signal that is based on the second pixel signal of the reset level. The amplification transistor M5 generates the first signal by amplifying the first pixel signal of the signal level held in the capacitance element Cs. in other words, the amplification transistor M5 generates the first pixel signal that is based on the first pixel signal of the signal level. The column selection transistor M6 outputs the second signal generated by the amplification transistor M4 to the second horizontal signal line 72. The column selection transistor M7 outputs the first signal generated by the amplification transistor M5 to the first horizontal signal line 71. The column selection transistor M6 and the column selection transistor M7 of the first column are controlled on the basis of the selection pulse HSR[1]. The column selection transistor M6 and the column selection transistor M7 of the second column are controlled on the basis of the selection pulse HSR[2]. The column selection transistor M6 and the column selection transistor M7 of the third column are controlled on the basis of the selection pulse HSR[3].

Figure 10:
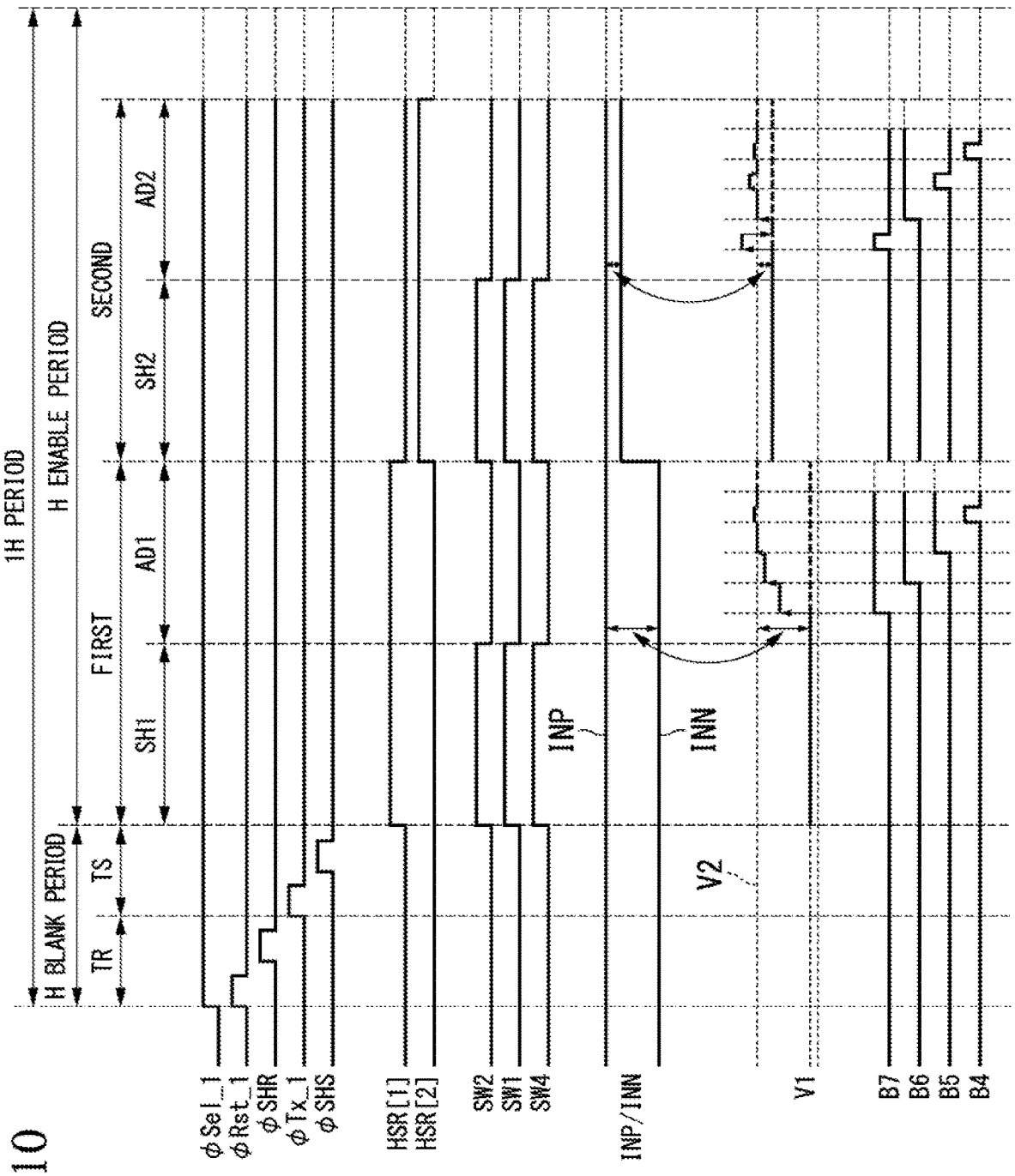
FIG. 10 is a timing chart showing an operation of the imaging device according to the fourth embodiment of the present invention.

An operation of the imaging device 1 will be described. FIG. 10 shows the operation of the imaging device 1. Hereinafter, an operation in which the imaging device 1 reads a pixel signal will be described. As a representative, the operation in which the imaging device 1 reads the pixel signal from the pixel 3 of the first row in the array of the plurality of pixels 3 will be described.

In FIG. 10, waveforms of the selection pulse φSel_1, the reset pulse φRst_1, the sample-and-hold pulse φSHR, the transfer pulse φTx_1, the sample-and-hold pulse φSHS, the selection pulse HSR[1], and the selection pulse HSR[2] are shown. In FIG. 10, a waveform of a control signal of each of the second switch SW2, the first switch SW1, and the fourth switch SW4 is shown. In FIG. 10, waveforms of the first signal INN and the second signal INP are shown. In FIG. 10, a waveform of a first voltage V1 of the first input terminal Tcmp1 of the comparator CMP1 is shown. In FIG. 10, waveforms of the signal B7, the signal B6, the signal B5, and the signal B4 are shown. In FIG. 10, waveforms of the signals B3 to B0 are not shown. The horizontal direction in FIG. 10 represents time and the vertical direction in FIG. 10 represents voltage.

A 1H period in which a pixel signal of one row is read includes an H blank period and an H enable period. The H blank period includes a first reading period TR in which the second pixel signal of the reset level is read and a second reading period TS in which the first pixel signal of the signal level is read. Before the 1H period is started, the selection pulse φSel_1, the reset pulse φRst_1, the sample-and-hold pulse φSHR, the transfer pulse φTx_1, the sample-and-hold pulse φSHS, the selection pulse HSR[1], and the selection pulse HSR[2] are at the low level, The H enable period includes a plurality of periods in which the AD conversion circuit 10 sequentially performs AD conversion a plurality of times. A period in which AD conversion of each time is performed includes a sample-and-hold period and an AD conversion period. Before the first AD conversion is performed, the control signal of each of the second switch SW2, the first switch SW1, and the fourth switch SW4 is at the low level.

When the H blank period is started, the selection pulse φSel_1 output from the vertical selection unit 4 to the pixel 3 of the first row changes from the low level to the high level. For this reason, the selection transistor Sel is turned on. In this way, the pixel 3 of the first row is selected in the first reading period TR.

(Reading of Reset Level)

The reset pulse φRst_1 output from the vertical selection unit 4 to the pixel 3 of the first row changes from the low level to the high level. For this reason, the reset transistor Rst is turned on. In this way, the charge storage portion FD is reset and the second pixel signal of the reset level is output to the vertical signal line 70. Thereafter, the reset pulse φRst_1 changes from the high level to the low level. For this reason, the reset transistor Rst is turned off.

Thereafter, the sample-and-hold pulse φSHR changes from the low level to the high level. In this way, the sample transistor M2 is turned on. Thereafter, the sample-and-hold pulse φSHR changes from the high level to the low level. In this way, the sample transistor M2 is turned off. For this reason, the second pixel signal of the reset level is held in the capacitance element Cr.

(Reading of Signal Level)

The transfer pulse φTx_1 output from the vertical selection unit 4 to the pixel 3 of the first row changes from the low level to the high level in the second reading period TS. For this reason, the transfer transistor Tx is turned on. In this way, the signal charge of the photoelectric conversion unit PD is transferred to the charge storage portion FD and the first pixel signal of the signal level is output to the vertical signal line 70. Thereafter, the transfer pulse φTx_1 changes from the high level to the low level. For this reason, the transfer transistor Tx is turned off.

Thereafter, the sample-and-hold pulse φSHS changes from the low level to the high level. For this reason, the sample transistor M3 is turned on. Thereafter, the sample-and-hold pulse φSHS changes from the high level to the low level. For this reason, the sample transistor M3 is turned off. In this way, the first pixel signal of the signal level is held in the capacitance element Cs.

When the second reading period TS is completed, the H enable period is started and the first AD conversion is started. At this time, the selection pulse HSR[1] output from the horizontal selection unit 6 to the column circuit 8 of the first column changes from the low level to the high level. For this reason, the column selection transistor M6 and the column selection transistor M7 are turned on. In this way, the second signal in accordance with the second pixel signal of the reset level of the pixel 3 in the first row and the first column is output to the second horizontal signal line 72. At the same time, the first signal in accordance with the first pixel signal of the signal level of the pixel 3 in the first row and the first column is output to the first horizontal signal line 71. Thereafter, the selection pulse HSR[1] changes from the high level to the low level. For this reason, the column selection transistor M6 and the column selection transistor M7 are turned off. According to the above-described operation, the first signal that is based on the first pixel signal of the pixel 3 in the first row and the first column and the second signal that is based on the second pixel signal of the pixel 3 in the first cow and the first column are read.

The period in which the first AD conversion is performed includes a sample-and-hold period SH1 and an AD conversion period AD1. An operation of the AD conversion circuit 10 in the sample-and-hold period SH1 and the AD conversion period AD1 is similar to the operation shown in FIG. 2.

When the selection pulse HSR[1] changes from the high level to the low level, the first AD conversion is completed and the second AD conversion is started. At this time, the selection pulse HSR[2] changes from the low level to the high level. In this way, as with the above-described operation, the first signal that is based on the first pixel signal of the pixel 3 in the first row and the second column and the second signal that is based on the second pixel signal of the pixel 3 in the first row and the second column are read.

The period in which the second AD conversion is performed includes a sample-and-hold period SH2 and an AD conversion period AD2. An operation of the AD conversion circuit 10 in the sample-and-hold period SH2 and the AD conversion period AD2 is similar to the operation shown in FIG. 2.

When the selection pulse HSR[2] changes from the high level to the low level, the second AD conversion is completed and the third AD conversion is started. The third AD conversion is not shown in FIG. 10.

After the third AD conversion is completed, the selection pulse φSel_1 changes from the high level to the low level. For this reason, the selection transistor Sel is turned off. In this way, the selection of the pixel 3 of the first row is canceled and the operation in which the pixel signal is read from the pixel 3 of the first row is completed. Following the operation shown in FIG. 10, the imaging device 1 reads the pixel signal from the pixel 3 of the second row. This operation is similar to the operation shown in FIG. 10.

As described above, the imaging device 1 includes the AD conversion circuit 10, the plurality of pixels 3, and the column circuit 8. The plurality of pixels 3 are disposed in a matrix shape. The plurality of pixels 3 output the first pixel signal having the signal level and the second pixel signal having the reset level. The column circuit 8 is disposed so as to correspond to one or more columns in the array of the plurality of pixels 3. The column circuit 8 generates the first signal in accordance with the first pixel signal and the second signal in accordance with the second pixel signal.

The imaging device 1 may include any one of the AD conversion circuit 11 shown in FIG. 3, the AD conversion circuit 12 shown in FIG. 4, the AD conversion circuit 13 shown in FIG. 5, and the AD conversion circuit 14 shown in FIG. 6 instead of the AD conversion circuit 10.

The imaging device according to each aspect of the present invention may not include a configuration other than a configuration corresponding to each of the AD conversion circuit 10, the plurality of pixels 3, and the column circuit 8.

As described above, the imaging device 1 includes the AD conversion circuit 10 that can shorten the processing time of AD conversion. For this reason, the imagining device 1 can shorten the processing time of AD conversion.

The voltage of the signal in accordance with the reset level is almost the same between the pixels 3. However, there is a case in which the voltage of the signal in accordance with the signal level is significantly different between the pixels 3. In the imaging device 1 including any one of the AD conversion circuit 10, the AD conversion circuit 11, the AD conversion circuit 12, and the AD conversion circuit 13, the following effects are obtained. The second signal in accordance with the reset level is held in the second capacitance element C2. While the comparator CMP1 compares the first voltage with the second voltage, the second voltage is almost constant. For this reason, the operation point of the comparator CMP1 is almost the same. In this way, the imaging device 1 can perform AD conversion on the signal that is based on the difference between the reset leveland the signal level with high precision.

Fifth Embodiment

Figure 11:
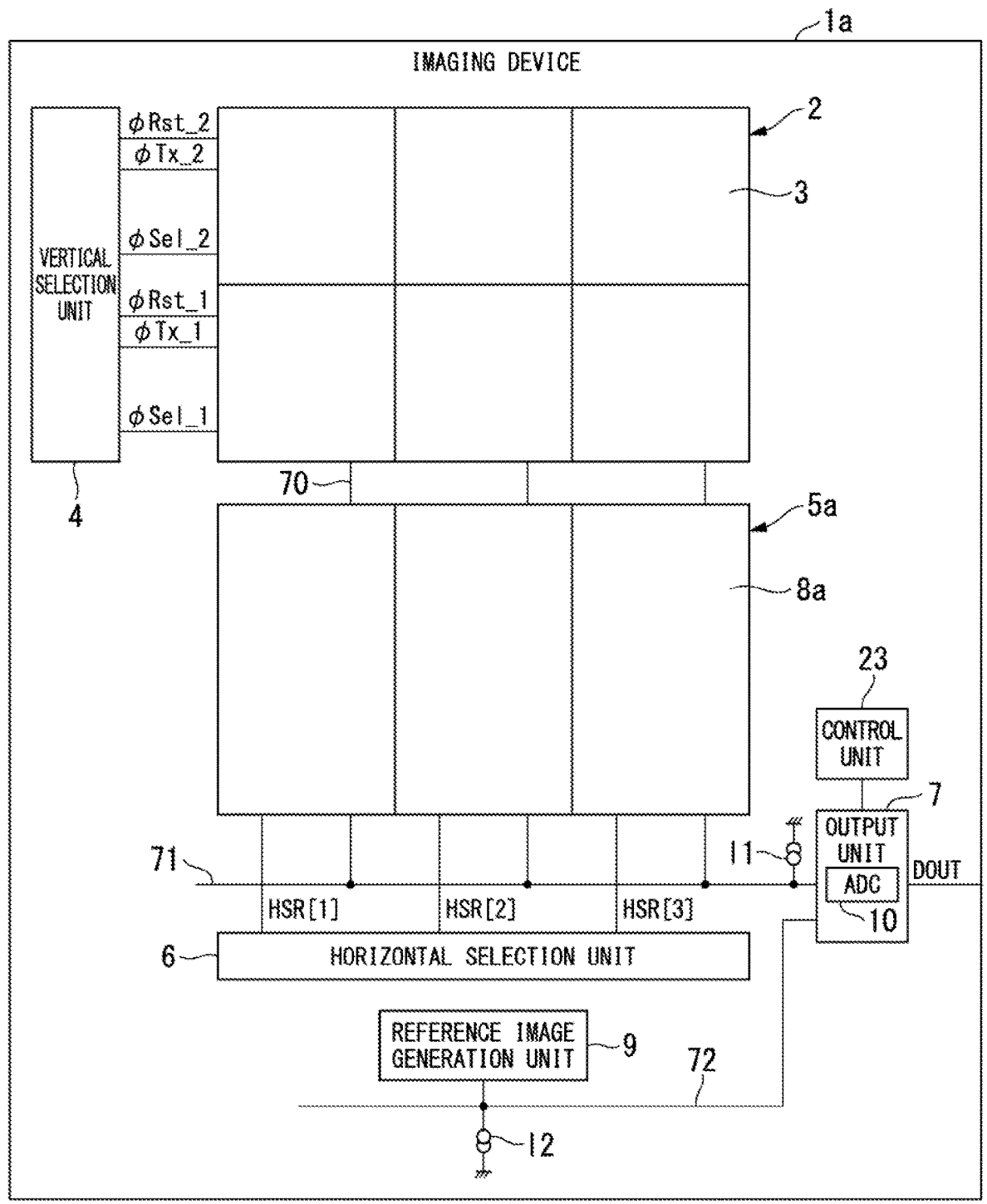
FIG. 11 is a block diagram showing a configuration of an imaging device according to a fifth embodiment of the present invention.

FIG. 11 shows a configuration of an imaging device 1a according to a fifth embodiment of the present invention. In terms of the configuration shown in FIG. 11, points different from the configuration shown in FIG. 7 will be described.

The imaging deice 1a includes a reference signal generation unit 9 (signal generation circuit) in addition to the configuration shown in FIG. 7. In the imaging device 1a, the column circuit unit 5 shown in FIG. 7 is changed to a column circuit unit 5a. In the colunm circuit unit 5a, the column circuit 8 shown in FIG. 7 is changed to a column circuit 8a. The column circuit unit 5a includes a plurality of column circuits 8a. The column circuit 8a is disposed for each column in the array of the plurality of pixels 3. The column circuit 8a is connected to the vertical signal line 70. The column circuit 8a is electrically connected to the pixel 3 through the vertical signal line 70. The column circuit 8a generates a difference signal, i.e., the first signal in accordance with the difference between the reset level and the signal level output from the pixel 3. The column circuit 8a is connected to the first horizontal signal line 71. A selection pulse HSR[k] is output from the horizontal selection unit 6 to the column circuit 8a corresponding to a column k. k is any one of one, two, and three. The column circuit 8a selected on the basis of the selection pulse HSR[k] outputs the first signal to the first horizontal signal line 71.

In terms of points other than the above, the configuration shown in FIG. 11 is similar to the configuration shown in FIG 7.

Figure 12:
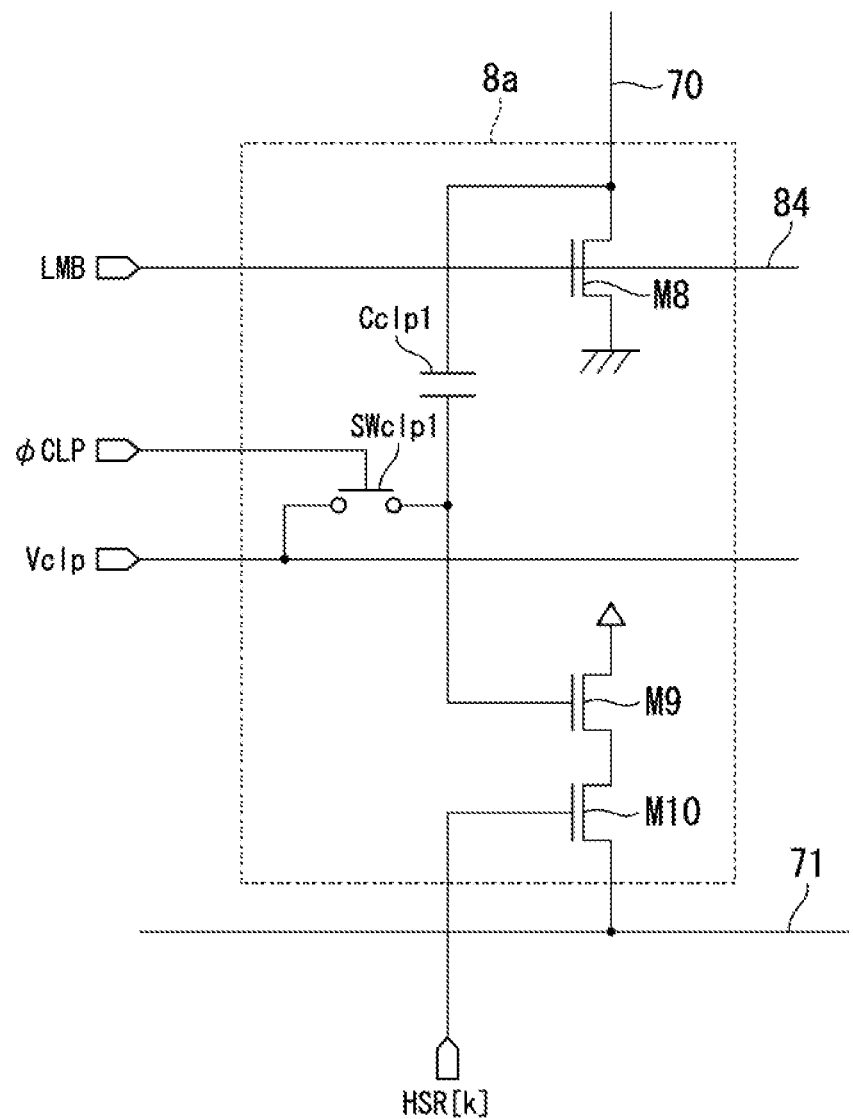
FIG. 12 is a circuit diagram showing a configuration of a column circuit according to the fifth embodiment of the present invention.

FIG. 12 shows a configuration of the column circuit 8a. As shown in FIG. 12, the column circuit 8a includes a transistor M8, a capacitance element Cclp1, a clamp switch SWclp1, an amplification transistor M9, and a column selection transistor M10. Each transistor shown in FIG. 12 is an NMOS transistor. Each transistor shown in FIG. 12 includes a gate terminal, a source terminal, and a drain terminal.

The drain terminal of the transistor M8 is connected to the vertical signal line 70. The source terminal of the transistor M8 is connected to the ground. The gate terminal of the transistor M8 is connected to the power source line 84. The power source line 84 is connected to a power source that outputs a predetermined voltage LMB.

The capacitance element Cclp1 includes a first terminal and a second terminal. The first terminal of the capacitance element Cclp1 is connected to the vertical signal line 70. The second terminal of the capacitance element Cclp1 is connected to the clamp switch SWclp1 and the amplification transistor M9.

The clamp switch SWclp1 includes a first terminal and a second terminal. The first terminal of the clamp switch SWclp1 is connected to the second terminal of the capacitance element Cclp1. A clamp voltage Vclp is input to the second terminal of the clamp switch SWclp1.

The power source voltage VDD is input to the drain terminal of the amplification transistor M9. The source terminal of the amplification transistor M9 is connected to the column selection transistor M10. The gate terminal of the amplification transistor M9 is connected to the second terminal of the capacitance element Cclp1.

The drain terminal of the column selection transistor M10 is connected to the source terminal of the amplification transistor M9. The source terminal of the column selection transistor M10 is connected to the first horizontal signal line 71. The gate terminal of the column selection transistor M10 is connected to the horizontal selection unit 6.

An operation of the clamp switch SWclp1 is controlled on the basis of a clamp pulse ϕCLP. An operation of the column selection transistor M10 is controlled on the basis of a selection pulse HSR[k] output from the horizontal selection unit 6. k is any one of one, two, and three.

The transistor M8 functions as a current source. The state of the clamp switch SWclp1 becomes any one of an ON state and an OFF state. When the clamp switch SWclp1 is in the ON state, the capacitance element Cclp1 is clamped to the clamp voltage Vclp. After the capacitance element Cclp1 is clamped, the capacitance element Cclp1 holds the pixel signal in accordance with the difference between the reset level and the signal level output from the pixel 3 to the vertical signal line 70. The capacitance element Cclp1 is a clamp capacitor. The amplification transistor M9 generates the difference signal, i.e., the first signal in accordance with the difference between the reset level and the signal level by amplifying the pixel signal held in the capacitance element Cclp1. The column selection transistor M10 outputs the first signal generated by the amplification transistor M9 to the first horizontal signal line 71. The column selection transistor M10 of the first column is controlled on the basis of a selection pulse HSR[1]. The column selection transistor M10 of the second column is controlled on the basis of a selection pulse HSR[2]. The column selection transistor M10 of the third column is controlled on the basis of a selection pulse HSR[3].

Figure 13:
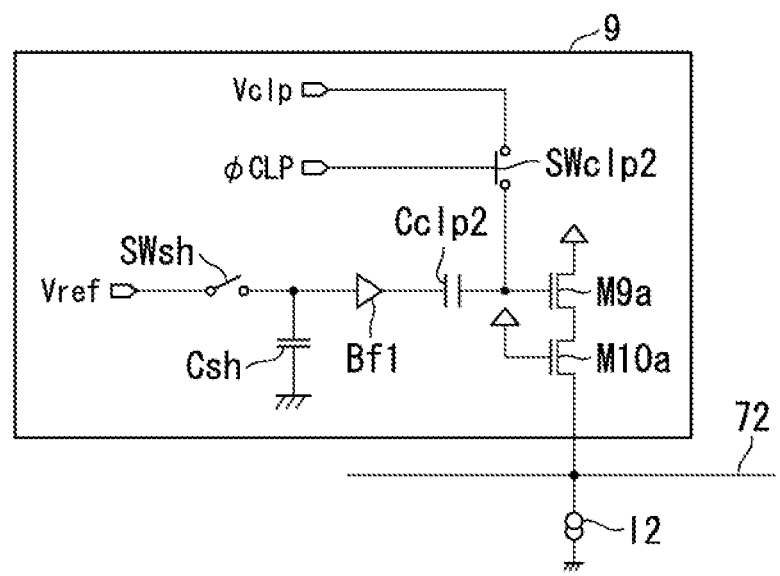
FIG. 13 is a circuit diagram showing a configuration of a reference signal generation unit according to the fifth embodiment of the present invention.

FIG 13 shows a configuration of the reference signal generation unit 9. As shown in FIG 13, the reference signal generation unit 9 includes a sample switch SWsh, a capacitance element Csh, a buffer Bf1, a capacitance element Cclp2, a clamp switch SWclp2, an amplification transistor M9a, and a selective transistor M10a.

The sample switch SWsh includes a first terminal and a second terminal. A reference voltage Vref is input to the first terminal of the sample switch SWsh. The reference voltage Vref is generated on the basis of the power source voltage VDD. The second terminal of the sample switch SWsh is connected to the capacitance element Csh.

The capacitance element Csh includes a first terminal and a second terminal. The first terminal of the capacitance element Csh is connected to the second terminal of the sample switch SWsh. The second terminal of the capacitance element Csh is connected to the ground.

The buffer Bf1 includes a first terminal and a second terminal. The first terminal of the buffer Bf1 is connected to the second terminal of the sample switch SWsh and the first terminal of the capacitance element Csh. The second terminal of the buffer fill is connected to the capacitance element Cclp2.

The capacitance element Cclp2 includes a first, terminal and a second terminal. The first terminal of the capacitance element Cclp2 is connected to the second terminal of the buffer Bf1. The second terminal of the capacitance element Cclp2 is connected to the clamp switch SWclp2 and the amplification transistor M9a.

The clamp switch SWclp2 includes a first terminal and a second terminal. The first terminal of the clamp switch SWclp2 is connected, to the second terminal of the capacitance element Cclp2. The clamp voltage Vclp is input to the second terminal of the clamp switch SWclp2.

The amplification transistor M9a and the selection transistor M10a are NMOS transistors. Each of the amplification transistor M9a and the selection transistor M10a includes a gate terminal, a source terminal, and a drain terminal. The power source voltage VDD is input to the drain terminal of the amplification transistor M9a. The source terminal of the amplification transistor M9a is connected to the selection transistor M10a. The gate terminal of the amplification transistor M9a is connected to the second terminal of the capacitance element Cclp2.

The drain terminal of the selection transistor M10a is connected to the source terminal of the amplification transistor M9a. The source terminal of the selection transistor M10a is connected to the second horizontal signal line 72. The power source voltage VDD is input to the gate terminal of the selection transistor M10a.

The state of the sample switch SWsh becomes any one of an ON state and an OFF state. When the sample switch SWsh is in the ON state, the sample switch SWsh samples the reference voltage Vref. When the state of the sample switch SWsh changes from the ON state to the OFF state, the reference voltage Vref sampled by the sample switch SWsh is held in the capacitance element Cclp2 through the buffer Bf1.

The state of the clamp switch SWclp2 becomes any one of an ON state and an OFF state. When the clamp switch SWclp2 is in the ON state, the capacitance element Cclp2 is clamped to the clamp voltage Vclp. The operation of the clamp switch SWclp2 is controlled on the basis of the clamp pulse φCLP.

The capacitance element Cclp2 holds the voltage (Vclp) clamped by the clamp switch SWclp2. The capacitance element Cclp2 is a clamp capacitor. The amplification transistor M9a generates a reference signal by amplifying the voltage of the second terminal of the capacitance element Cclp2. In other words, the amplification transistor M9a generates the reference signal that is based on the voltage of the second terminal of the capacitance element Cclp2. The selection transistor M10a outputs the reference signal generated by the amplification transistor M9a to the second horizontal signal line 72. This reference signal is the second signal.

The capacitance element Cclp2, the clamp switch SWclp2, the amplification transistor M9a, and the selection transistor M10a in the reference signal generation unit 9 are constituted similarly to the capacitance element Cclp1, the clamp switch SWclp1, the amplification transistor M9, and the column selection transistor M10 in the column circuit 8a, respectively.

Figure 14:
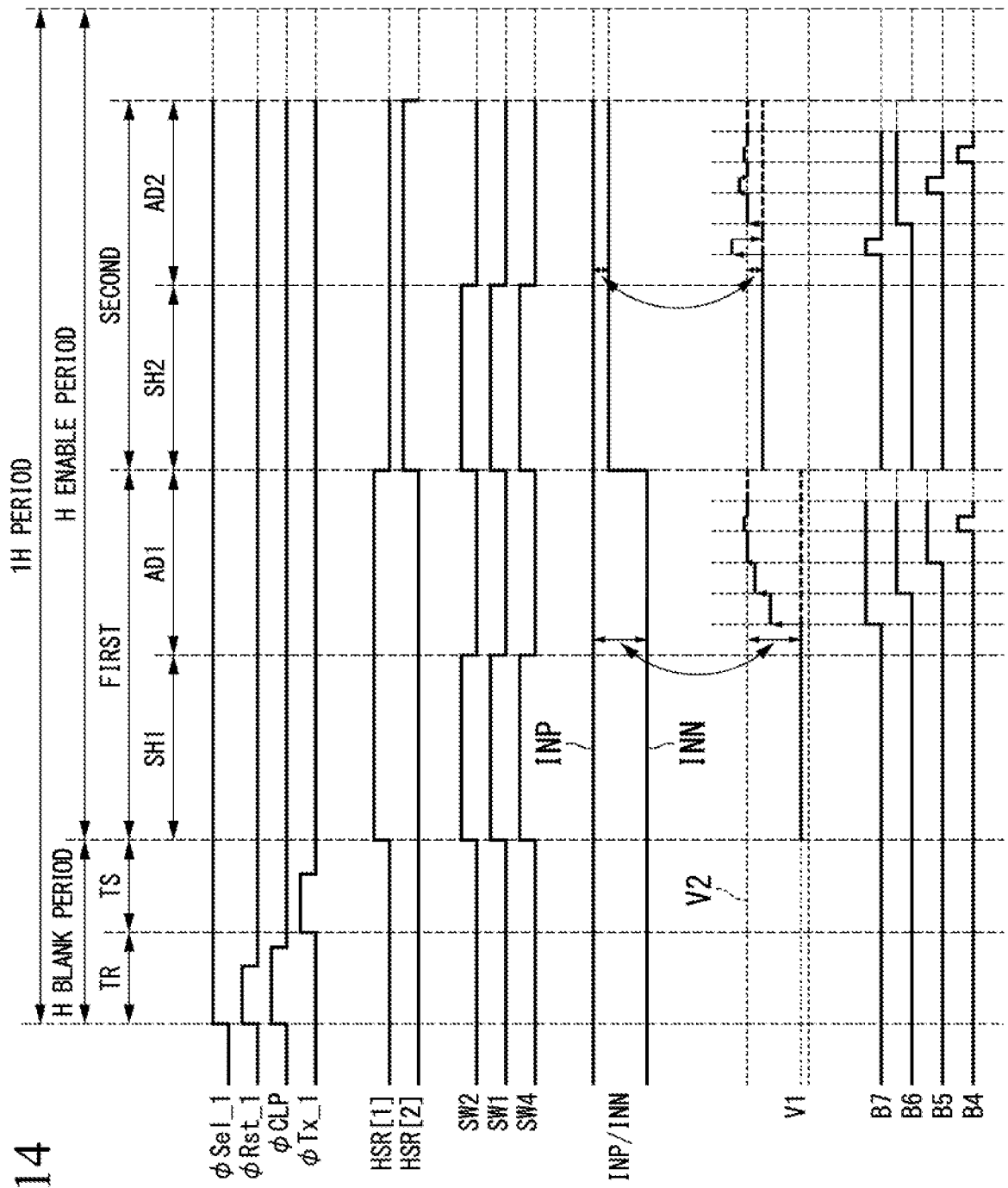
FIG. 14 is a timing chart showing an operation of the imaging device according to the fifth embodiment of the present invention.

An operation of the imaging device 1a will be described. FIG. 14 shows the operation of the imaging device 1a. Hereinafter, an operation in which the imaging device 1a reads a pixel signal will be described. As a representative, the operation in which the imaging device 1a reads the pixel signal from the pixel 3 of the first row in the array of the plurality of pixels 3 will be described.

In FIG. 14, waveforms of the selection pulse φSel_1, the reset pulse φRst_1, the clamp pulse φCLP, the transfer pulse φTx_1, the selection pulse HSR[1], and the selection pulse HSR[2] are shown. In FIG. 14, a waveform of a control signal of each of the second switch SW2, the first switch SW1, and the fourth switch SW4 is shown. In FIG. 14, waveforms of the first signal INN and the second signal INP are shown. In FIG. 14, a waveform of a first voltage V1 of the first input terminal Tcmp1 of the comparator CMF1 is shown. In FIG 14, waveforms of the signal B7, the signal B6, the signal B5, and the signal B4 are shown. In FIG. 14, waveforms of the signals B3 to B0 are not shown. The horizontal direction in FIG. 14 represents time and the vertical direction in FIG. 14 represents voltage.

A 1H period in which a pixel signal of one row is read includes an H blank period and an H enable period. The H blank period includes a first reading period TR in which the second pixel signal of the reset level is read and a second reading period TS in which the first pixel signal of the signal level is read. Before the 1H period is started, the selection pulse φSel_1, the reset pulse φRst_1, the clamp pulse φCLP, the transfer pulse φTx_1, the selection pulse HSR[1], and the selection pulse HSR[2] are at the low level.

The H enable period includes a plurality of periods in which the AD conversion circuit 10 sequentially performs AD conversion a plurality of times. A period in which AD conversion of each time is performed includes a sample-and-hold period and an AD conversion period. Before the first AD conversion is performed, the control signal of each of the second switch SW2, the first switch SW1, and the fourth switch SW4 is at the low level.

When the H blank period is started, the selection pulse φSel_1 output from the vertical selection unit 4 to the pixel 3 of the first row changes from the low level to the high level. For this reason, the selection transistor Sel is turned on. In this way, the pixel 3 of the first row is selected in the first reading period TR. At the same time, the sample-and-hold pulse φSWsh changes from the low level to the high level. For this reason, the sample switch SWsh is turned on. Thereafter, the sample-and-hold pulse φSWsh changes from the high level to the low level. For this reason, the sample switch SWsh is turned off. In this way, the reference voltage Vref sampled by the sample switch SWsh is held in the capacitance element Cclp2 through the buffer Bf1.

(Reading of Reset Level)

The reset pulse φRst_1 output from the vertical selection unit 4 to the pixel 3 of the first row changes from the low level to the high level. For this reason, the reset transistor Rst is turned on. In this way, the charge storage portion FD is reset and the second pixel signal of the reset level is output to the vertical signal line 70. Furthermore, the clamp pulse φCLP changes from the low level to the high level. For this reason, the clamp switch SWclp1 and the clamp switch SWclp2 are turned on. In this way, the capacitance element Cclp1 and the capacitance element Cclp2 are clamped to the clamp voltage Vclp.

Thereafter, the reset pulse φRst_1 changes from the high level to the low level. For this reason, the reset transistor Rst is turned off. Thereafter, the clamp pulse φCLP changes from the high level to the low level. For this reason, the clamp switch SWclp1 and the clamp switch SWclp2 are turned off. In this way, the clamp voltage Vclp is held in the capacitance element Cclp1 and the capacitance element Cclp2.

(Reading of Signal Level)

The transfer pulse φTx_1 output from the vertical selection unit 4 to the pixel 3 of the first row changes from the low level to the high level in the second reading period TS. For this reason, the transfer transistor Tx is turned on. In this way, the signal charge of the photoelectric conversion unit PD is transferred to the charge storage portion FD and the first pixel signal of the signal level is output to the vertical signal line 70. Thereafter, the transfer pulse φTx_1 changes from the high level to the low level. For this reason, the transfer transistor Tx is turned off. In this way, the difference signal in accordance with the difference between the reset level and the signal level is held in the capacitance element Cclp1.

When the second reading period TS is completed, the H enable period is started and the first AD conversion is started. At this time, the selection pulse HSR[1] output from the horizontal selection unit 6 to the column circuit 8a of the first column changes from the low level to the high level. For this reason, the column selection transistor M10 is turned on. In this way, the difference signal, i.e., the first signal in accordance with the difference between the reset level and the signal level of the pixel 3 in the first row and the first column is output to the first horizontal signal line 71. Thereafter, the selection pulse HSR[1] changes from the high level to the low level. For this reason, the column selection transistor M10 is turned off. According to the above-described operation, the first signal in accordance with the difference between the reset level and the signal level of the pixel 3 in the first row and the first column is read.

The period in which the first AD conversion is performed includes a sample-and-hold period SH1 and an AD conversion period AD1. An operation of the AD conversion circuit 10 in the sample-and-hold period SH1 and the AD conversion period AD1 is similar to the operation shown in FIG. 2.

When the selection pulse HSR[1] changes from the high level to the low level, the first AD conversion is completed and the second AD conversion is started. At this time, the selection pulse HSR[2] changes from the low level to the high level. In this way, as with the above-described operation, the first signal in accordance with the difference between the reset level and the signal level of the pixel 3 in the first row and the second column is read.

The period in which the second AD conversion is performed includes a sample-and-hold period SH2 and an AD conversion period AD2. An operation of the AD conversion circuit 10 in the sample-and-hold period SH2 and the AD conversion period AD2 is similar to the operation shown in FIG. 2.

When the selection pulse HSR[2] changes from the high level to the low level, the second AD conversion is completed and the third AD conversion is started. The third AD conversion is not shown in FIG. 14.

After the third AD conversion is completed, the selection pulse φSel_1 changes from the high level to the low level. For this reason, the selection transistor Sel is turned off. In this way, the selection of the pixel 3 of the first row is canceled and the operation in which the pixel signal is read from the pixel 3 of the first row is completed. Following the operation shown FIG. 14, the imaging device 1a reads the pixel signal from the pixel 3 of the second row. This operation is similar to the operation shown in FIG. 14.

As described above, the imaging device 1a includes the AD conversion circuit 10, the plurality of pixels 3, the column circuit 8a, and the reference signal generation unit 9. The plurality of pixels 3 are disposed in a matrix shape. The plurality of pixels 3 output the first pixel signal having the signal level and the second pixel signal having the reset level. The column circuit 8a is disposed so as to correspond to one or more columns in the array of the plurality of pixels 3. The column circuit 8a generates the first signal in accordance with the difference between the reset level and the signal level. The reference signal generation unit 9 generates the reference signal (second signal) having a predetermined level.

The imaging device 1a may include any one of the AD conversion circuit 11 shown in FIG. 3, the AD conversion circuit 12 shown in FIG. 4, the AD conversion circuit 13 shown in FIG. 5, and the AD conversion circuit 14 shown in FIG. 6 instead of the AD conversion circuit 10.

The imaging device according to each aspect of the present invention may not include a configuration other than a configuration corresponding to each of the AD conversion circuit 10, the plurality of pixels 3, the column circuit 8a, and the reference signal generation unit 9.

As described above, the imaging device 1a includes the AD conversion circuit 10 that can shorten the processing time of AD conversion. For this reason, the imaging device 1a can shorten the processing time of AD conversion.

The voltage of the reference signal generated by the reference signal generation unit 9 is almost constant. However, there is a case in which the voltage of the difference signal in accordance with the reset level and the signal level is significantly different between the pixels 3. In the imaging device 1a including any one of the AD conversion circuit 10, the AD conversion circuit 11, the AD conversion circuit 12, and the AD conversion circuit 13, the following effects are obtained. The second signal in accordance with the reference signal is held in the second capacitance element C2. While the comparator CMP1 compares the first voltage with the second voltage, the second voltage is almost constant. For this reason, the operation point of the comparator CMP1 is almost the same. In this way, the imaging device 1a can perform AD conversion on the signal that is based on the difference between the reference signal and the difference signal with high precision.

Sixth Embodiment

Figure 15:
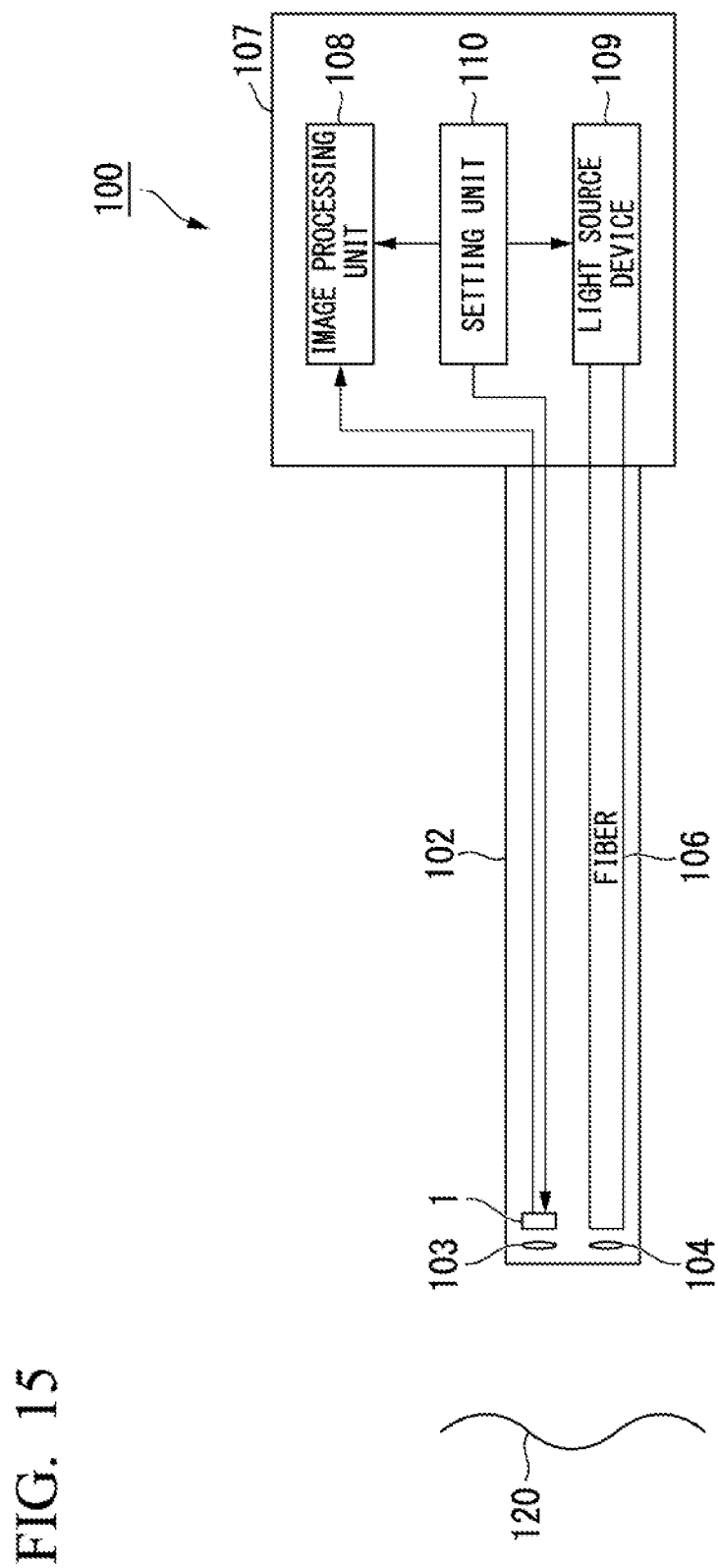
FIG. 15 is a block diagram showing a configuration of an endoscope system according to a sixth embodiment of the present invention.

FIG. 15 shows a configuration of an endoscope system 100 according to a sixth embodiment of the present invention. The endoscope system 100 includes the imaging device 1 according to the fourth embodiment. As shown in FIG. 15, the endoscope system 100 includes a scope 102 and a housing 107. The scope 102 includes the imaging device 1, a lens 103, a lens 104, and a fiber 106. The imaging device 1, the lens 103, and the lens 104 are disposed at the tip end part of the scope 102. The housing 107 includes an image processing unit 108, a light source device 109, and a setting unit 110.

The lens 103 forms an image of reflected light from a subject 120 on the imaging device 1. The fiber 106 transfers illumination light with which the subject 120 is irradiated. The lens 104 irradiates the subject 120 with the illumination light transferred by the fiber 106. The light source device 109 includes a light source that generates the illumination light with which the subject 120 is irradiated. The image processing unit 108 generates a captured image by performing predetermined processing on a signal output from the imaging device 1. The setting unit 110 controls an imaging mode of the endoscope system 100.

The configuration of the endoscope system 100 is not limited to the above-described configuration. The endoscope system according to each aspect of the present invention may not include a configuration corresponding to at least one of the lens 103, the lens 104, the fiber 106, the image processing unit 108, the light source device 109, and the setting unit 110.

Instead of the imaging device 1, the imaging device 1a shown in FIG. 11 may be used.

The endoscope system 100 according to the sixth embodiment includes the imaging device 1 that can shorten the processing time of AD conversion. For this reason, the endoscope system 100 can shorten the processing time of AD conversion.

While preferred embodiments of the invention have been described and shown above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An AD conversion circuit comprising:
   a comparison circuit;
   a first DA conversion circuit including a plurality of resistance elements; and
   a first voltage output circuit,
   wherein the comparison circuit includes:
      a first capacitance element that includes a first terminal to which a first signal is input and a second terminal electrically connected to the first DA conversion circuit and the first voltage output circuit and is configured to hold the first signal;
      a second capacitance element that includes a first terminal to which a second signal is input and a second terminal connected to a first voltage source and is configured to hold the second signal; and
      a comparator that includes a first input terminal connected to the first terminal of the first capacitance element, includes a second input terminal connected to the first terminal of the second capacitance element, and is configured to output a signal that represents a result of comparing a first voltage of the first input terminal with a second voltage of the second input terminal,
   a first combined resistance value of the first DA conversion circuit and the first voltage output circuit seen from the second terminal of the first capacitance element is a first value when the first capacitance element holds the first signal,
   the first combined resistance value is a second value when the comparator compares the first voltage with the second voltage, and
   the first value is less than the second value.

2. The AD conversion circuit according to claim 1,
   wherein the first voltage output circuit is configured to output a third voltage to the second terminal of the first capacitance element when the first capacitance element holds the first signal, and
   the first voltage output circuit is electrically insulated from the second terminal of the first capacitance element when the comparator compares the first voltage with the second voltage.

3. The AD conversion circuit according to claim 1,
   wherein a resistance value of the first voltage output circuit when the comparator compares the first voltage with the second voltage is greater than a resistance value of the first voltage output circuit when the first capacitance element holds the first signal.

4. The AD conversion circuit according to claim 1,
   wherein at least part of the plurality of resistance elements included in the first DA conversion circuit forms an R-2R ladder circuit.

5. The AD conversion circuit according to claim 1, further comprising an adjustment circuit configured to adjust a full-scale range of the first DA conversion circuit.

6. The AD conversion circuit according to claim 1, further comprising:
   a second DA conversion circuit including a plurality of resistance elements; and
   a second voltage output circuit,
   wherein the second terminal of the second capacitance element is electrically connected to the second DA conversion circuit and the second voltage output circuit that are the first voltage source,
   a second combined resistance value of the second DA conversion circuit and the second voltage output circuit seen from the second terminal of the second capacitance element is a third value when the second capacitance element holds the second signal,
   the second combined resistance value is a fourth value when the comparator compares the first voltage with the second voltage, and
   the third value is less than the fourth value.

7. The AD conversion circuit according to claim 6,
   wherein the second voltage output circuit is configured to output a fourth voltage to the second terminal of the second capacitance element when the second capacitance element holds the second signal, and
   the second voltage output circuit is electrically insulated from the second terminal of the second capacitance element when the comparator compares the first voltage with the second voltage.

8. The AD conversion circuit according to claim 6,
   wherein a resistance value of the second voltage output circuit when the comparator compares the first voltage with the second voltage is greater than a resistance value of the second voltage output circuit when the second capacitance element holds the second signal.

9. An imaging device comprising:
   the AD conversion circuit according to claim 1;
   a plurality of pixels that are disposed in a matrix shape and are configured to output a first pixel signal having a signal level and a second pixel signal having a reset level; and
   a column circuit that is disposed so as to correspond to one or more columns in an array of the plurality of pixels and is configured to generate the first signal in accordance with the first pixel signal and the second signal in accordance with the second pixel signal.

10. An imaging device comprising:
    the AD conversion circuit according to claim 1;
    a plurality of pixels that are disposed in a matrix shape and are configured to output a first pixel signal having a signal level and a second pixel signal having a reset level;

a column circuit that is disposed so as to correspond to one or more columns in an array of the plurality of pixels and is configured to generate the first signal in accordance with a difference between the reset level and the signal level; and a reference signal generation circuit configured to generate the second signal having a predetermined level.

11. An endoscope system comprising the imaging device according to claim 9.

12. An endoscope system comprising the imaging device according to claim 10.

* * * * *